United States Patent
Asada et al.

[11] Patent Number: 6,158,141
[45] Date of Patent: Dec. 12, 2000

[54] APPARATUS AND METHOD FOR DRYING SEMICONDUCTOR SUBSTRATE

[75] Inventors: Kazumi Asada; Hayato Iwamoto, both of Kanagawa; Teruomi Minami, Fukuoka, all of Japan

[73] Assignees: Sony Corporation; Tokyo Electron Limited, both of Tokyo, Japan

[21] Appl. No.: 09/304,039

[22] Filed: May 4, 1999

[30] Foreign Application Priority Data

| May 7, 1998 | [JP] | Japan | 10-124933 |
| May 7, 1998 | [JP] | Japan | 10-124934 |
| May 7, 1998 | [JP] | Japan | 10-124935 |

[51] Int. Cl.[7] .................................................. F26B 21/00
[52] U.S. Cl. .................... 34/74; 34/77; 34/78; 134/25.4; 134/902
[58] Field of Search .................. 34/364, 370, 380, 34/381, 402, 406, 74, 77, 78, 208, 210; 134/2, 25.4, 30, 95.4, 902

[56] References Cited

U.S. PATENT DOCUMENTS

| 5,575,079 | 11/1996 | Yokomizo et al. ........................ 34/78 |
| 5,653,045 | 8/1997 | Ferrell ........................................ 34/341 |
| 5,671,544 | 9/1997 | Yokomizo et al. ........................ 34/78 |
| 5,772,784 | 6/1998 | Mohindra et al. ....................... 134/21 |
| 5,950,328 | 9/1999 | Ichiko et al. ............................. 34/364 |
| 5,956,859 | 9/1999 | Matsumoto et al. .................... 34/78 X |
| 5,985,041 | 11/1999 | Florez ........................................ 134/2 |
| 6,029,371 | 2/2000 | Kamikawa ................................ 34/516 |

*Primary Examiner*—Stephen Gravini
*Attorney, Agent, or Firm*—Sonnenschein, Nath & Rosenthal

[57] ABSTRACT

An apparatus and method for drying semiconductor substrates to dry about 50 semiconductor wafers by evaporating an organic solvent and blowing the evaporated organic solvent onto these semiconductor wafers through a nozzle, comprises the evaporate organic solvent being blown onto the semiconductor wafers from a direction aslant by an angle from 20° to 50° from a vertical direction toward the semiconductor wafers. At this time, the initial spray amount of the evaporated organic solvent is not less than 0.8 cc/second and not more than 1.5 cc/second, additionally, the amount of the organic solvent used for drying is not less than 70 cc/batch and not more than 200 cc/batch.

24 Claims, 15 Drawing Sheets

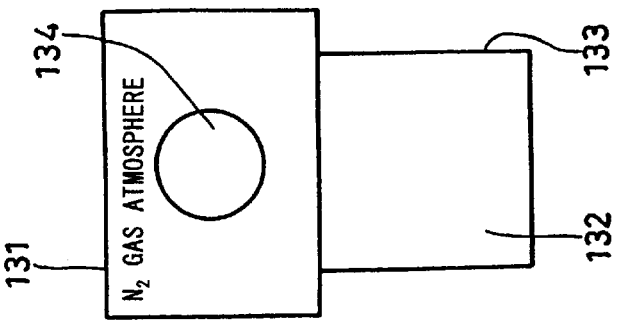
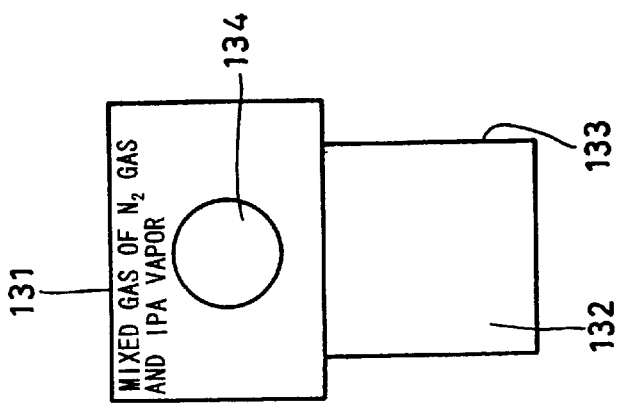
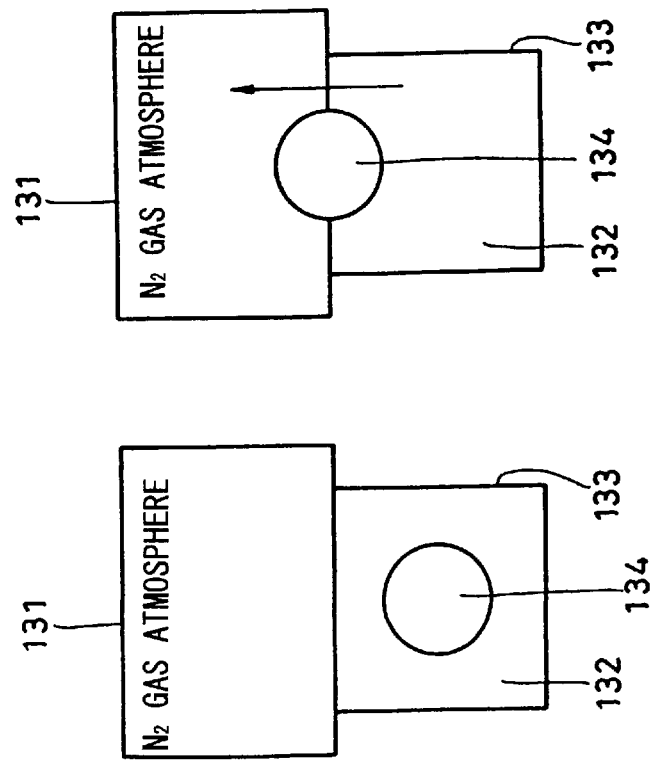

Fig. 14

| SPRAY AMOUNT [cc/s] | IPA SPRAYING TIME [S] | | | | | | |
|---|---|---|---|---|---|---|---|
| | 50 | 70 | 80 | 90 | 105 | 150 | 200 |
| 0.8 | X | O | O | O | O | O | O |
| 0.5 | X | X | X | X | O | O | O |
| 0.3 | X | X | X | X | O | O | O |

Fig. 15

| SPRAY AMOUNT [cc/s] | IPA SPRAYING TIME [S] | | | | | | |
|---|---|---|---|---|---|---|---|
| | 50 | 70 | 80 | 90 | 105 | 150 | 200 |
| 0.8 | X | X | X | O | O | O | O |
| 0.5 | X | X | X | X | X | O | O |
| 0.3 | X | X | X | X | X | X | X |

APPARATUS AND METHOD FOR DRYING SEMICONDUCTOR SUBSTRATE

BACKGROUND OF THE INVENTION

1. Field of the Invention

This invention relates to a drying apparatus for drying semiconductor substrates and a method for drying semiconductor substrates, especially suitable for application to a semiconductor substrate dryer configured to dry semiconductor substrates by blowing an evaporated organic solvent like isopropyl alcohol (IPA) onto the semiconductor substrates.

2. Description of the Related Art

An apparatus currently used in a rinse process of semiconductor wafers is configured, as shown in FIG. 1, to introduce a semiconductor waver 105 into rinse chambers 101, 102, 103 and a dry chamber 104 filled with IPA vapor to rinse and dry the semiconductor wafer 105. There are various methods as this rinsing process of the semiconductor wafer 105. First one (processing method 1) of them first introduce the semiconductor wafer 105 into the rinse tank 103 and then introduce it into the dry chamber 104 to dry it. The second rinsing method (processing method 2) first introduce the semiconductor wafer 105 into the rinse chambers 102 and 103, sequentially, and thereafter introduce it into the dry chambers 104 to dry it. The third rinsing method (processing method 3) first introduce the semiconductor wafer into the rinse chambers 101, 102 and 103, sequentially, and thereafter introduce it into the dry chamber 104 to dry it. In these processing method 1, processing method 2 and precessing method 3, the semiconductor wafer 104 always passes the dry chamber 104 for drying processing. Therefore, processing performance in the rinsing process of the semiconductor wafer 105 is determined by the drying processing time. Additionally, progressively enlarged sizes of semiconductor wafers have invited an increase of heat capacity of wafers to be dried, and the rinsing process of semiconductor wafers is rate-determined by the drying processing.

Among drying apparatuses actually used in the drying processing of semiconductor wafers, the major one is a drying apparatus employing a so-called IPA direct displacement drying system which is configured to dry these wafers by displacing water regaining on semiconductor wafer surfaces with IPA vapor of a high vapor pressure because of its good water replacing efficiency and drying performance. From the viewpoint of removing various problems such as generation of water marks, the drying apparatus employing the IPA direct displacement drying system is effective as compared with a spin dryer configured to repel water adhering on semiconductor wafer surfaces by a centrifugal force.

The conventional IPA vapor drying system is explained below. As shown in FIGS. 2A through 2D, the drier employing the IPS vapor drying system includes a dry chamber 111 filled with heated IPA vapor. To dry an object by using the drier, a semiconductor wafer 112 is first introduced at a high speed into the dry chamber 111 as shown in FIG. 2A, and then exposed to IPA vapor as shown in FIG. 2B. As a result, the semiconductor wafer 112 is heated to the temperature of the IPA vapor, and the IPA vapor displaces water on the surface of the semiconductor wafer 112 to thereby dry the semiconductor wafer 112. After that, as shown in FIGS. 2C and 2D, the semiconductor wafer 112 is slowly pulled up from the dry chamber 111 to complete the drying process. The IPA vapor drying system advantageously makes fewer water marks on dried semiconductor wafers and in electrically neutralizing semiconductor wafers.

However, the semiconductor wafer drying process using the above-explained IPA vapor drying apparatus involves the drawback that, due to a long dry-processing time, the through-put of the drying process is rate-determined by the drying process and results in decreasing the production capacity. In this connection, research has been made toward increasing the heating temperature of semiconductor wafers to reduce the dry-processing time. However, this approach invites problems such as bumping of IPA and producing an uneven drying effect.

Moreover, taking problems on the natural environment and residual organic substances into consideration, the industry has recently moved toward reducing the amount of organic materials to be used. Therefore, a drying method using the Marangoni effect and a controlled IPA vapor drying method has been mainly employed in drying apparatuses using IPA. These two drying methods are explained below.

A drying apparatus employing the drying method using the Marangoni effect is made up of a dry portion 121 and a rinse tank 123 filled with ultrapure water (DI water) 122 as shown in FIGS. 3A through 3D.

In a semiconductor wafer dry process using this drying apparatus, a semiconductor wafer 124 is first rinsed in the rinse tank 123 as shown in FIG. 3A. Then, the dry portion 121 contains a nitrogen ($N_2$) gas atmosphere or ambient atmosphere. Next, as shown in FIG. 3B, mixed gas of $N_2$ and IPA vapor is introduced into the dry portion 121 and blown onto the water surface of the ultrapure water 122 before the semiconductor wafer 124 is pulled out of the rinse tanks 123. As a result, as shown in FIG. 4, an IPA layer 125 is formed on the water surface. After that, as shown in FIG. 3C, the semiconductor wafer 124 is pulled out. When the semiconductor wafer 124 is pulled out, a gradient called meniscus portion is made along the interface between the surface of the semiconductor wafer 124 and the ultrapure water 122 as shown in FIG. 4, and the meniscus further increases by the IPA layer 125. While the semiconductor wafer 124 is pulled out, water remaining on its surface flows down along the meniscus portion. Then, the semiconductor wafer 124 is pulled out with no water remaining on its surface, and it is dried. Thereafter, as shown in FIG. 3D, $N_2$ gas atmosphere is restored in the dry portion 121. In this manner, the dry process of the semiconductor wafer 124 is performed.

The drying apparatus employing the controlled IPA vapor drying method is made up of a dry tank 131 and a rinse tank 133 filled with ultrapure water 132 as shown in FIGS. 5A through 5D. In this drying apparatus, the dry tank 131 contains a $N_2$ gas atmosphere as shown in FIG. 5A. In this status, after a semiconductor wafer 134 is rinsed in the rinse tanks 133, it is pulled out as shown in FIG. 5B, and transported into the dry chamber 131. Next, as shown in FIG. 5C, the dry tank 131 and the rinse tank 133 are blocked from each other by a cover (not shown), and mixed gas of $N_2$ and IPA vapor is blown onto the semiconductor wafer from a nozzle (not shown) located in an upper position in the dry chamber 131. Thus, by displacing water remaining on the surface of the semiconductor wafer 134 by the IPA vapor, the semiconductor wafer 134 is dried. After that, as shown in FIG. 5D, the $N_2$ gas atmosphere is restored in the dry tanks 131. In this manner, dry processing of the semiconductor wafer 134 is performed.

The controlled IPA vapor dry method of these two drying methods is certainly the method in place of the conventional IPA vapor dry method. However, as to conditions for drying semiconductor wafers, researches have been under trials and errors toward optimization of drying conditions.

OBJECTS AND SUMMARY OF THE INVENTION

It is therefore an object of the invention to provide a device and a method for drying semiconductor substrates which can reduce the drying time without inviting a decrease in drying capacity, thereby improve the dry-processing capacity, and also reduce the used amount of organic substances to a minimum necessary amount for the drying purpose to contribute to protection of the natural environment and reduce residual organic substances.

The Inventor made various experiments about drying of semiconductor wafers toward resolution of the above-mentioned problems involved in the conventional techniques, as summarized below.

As the first experiment, the Inventor executed dry-processing of semiconductor wafers using a controlled IPA vapor drying apparatus capable of drying about 50 semiconductor wafers simultaneously, and changing the IPA spray direction from a direction vertically downward pointing a semiconductor wafer to various angled directions relative to the semiconductor wafer by 10°, 20°, 30°, 50° and 90°, and measured the number of remaining particles and the number of water marks on each semiconductor wafer during the dry-processing. This method of evaluation for the measurement is configured to put a dummy semiconductor wafer on a wafer boat, set another semiconductor wafer with an oxide film in front of the semiconductor wafer to be evaluated in a mirror-faced state, and perform chemical processing such as DHF (dilute hydrofluoric acid) processing. Critical values used for evaluation are values acceptable for admitting sufficient drying capacity of the drying apparatus. Namely, it is determined that the number of particles remaining on each semiconductor wafer should be 20 or less and that the number of water marks on each semiconductor wafer should be 10 or less.

FIG. 6 shows dependency of the number of particles and the number of water marks on each semiconductor wafer thus measured upon the angle of the sprayed direction of IPA vapor.

It is noted from FIG. 6 that, in the controlled IPA vapor drying apparatus capable of drying about 50 semiconductor wafers simultaneously, the number of particles on each semiconductor wafer is 20 or less, and the number of water marks is 10 or less when the angle of the sprayed direction of IPA vapor is within the range from 20° to 50°. Under the other conditions, for example, with the angle of the sprayed direction of 10°, the number of particles on each semiconductor wafer was approximately 9, and the number of water marks was approximately 52. When the angle of the sprayed direction of IPA vapor is 90° or more, that is, when IPA vapor is sprayed in an upper direction than the horizontal direction, the semiconductor wafer after dry-processing remains half-dried, and water marks are detected on the entire surface. In contrast, when the angle of the sprayed direction of IPA vapor is 0° or less, that is, when the sprayed direction of IPA vapor is opposite from the semiconductor side, IPA vapor sometimes adheres directly onto side wall surfaces of the drying apparatus, or ascends without contacting the semiconductor wafer, and therefore cannot dry the semiconductor wafer. As a result, water spots remain.

It is noted from these results that, when the angle of the direction of IPA vapor blown onto the semiconductor wafer is within the range from 20° to 50° relative to the vertical direction, the number of particles on each semiconductor wafer is 20 or less and the number of water marks is 10 or less, which shows practically sufficient drying capacity.

As the second experiment, the Inventor tried dry-processing of semiconductor wafers by using a controlled IPA vapor drying apparatus capable of drying about 50 semiconductor wafers simultaneously and changing the initial spray amount of IPA vapor variously, namely, 0.3 cc/s, 0.5 cc/s, 0.7 cc/s, 1.0 cc/s and 1.5 cc/s, and measured the number of particles and the number of water marks on each semiconductor wafer in the dry-processing. This method of evaluation for the measurement is configured to put a dummy semiconductor wafer on a wafer boat, set another semiconductor wafer with an oxide film in front of the semiconductor wafer to be evaluated in a mirror-faced state, and perform chemical processing such as DHF (dilute hydrofluoric acid) processing. Critical values used for evaluation are 20 or less for both the number of particles and the number of water marks on each semiconductor wafer, which is acceptable for admitting sufficient drying capacity of the drying apparatus.

FIG. 7 shows dependency of the number of particles and the number of water marks on each semiconductor wafer thus measured upon the initial spray amount of IPA.

It is noted from FIG. 7 that, in the controlled IPA vapor drying apparatus capable of drying about 50 semiconductor wafers simultaneously, when the initial sprayed amount of IPA vapor is within the range from 0.5 cc/s to 1.5 cc/s, the number of particles on each semiconductor wafer is 20 or less. It is also noted that, when the initial spray amount of IPA vapor is within the range from 0.8 cc/s to 1.5 cc/s, the number of water marks on each semiconductor wafer is 20 or less, and when the initial spray amount of IPA vapor is 0.5 cc/s, the number of water marks on each semiconductor wafer is approximately 120. When the initial spray amount of IPA vapor is 0.3 cc/s or less, the semiconductor wafer after dry-processing remains half-dried, and water marks are detected on the entire surface. In contrast, when the initial spray amount of IPA vapor is larger than 1.5 cc/s, IPA vapor sprayed out from the nozzle exhibits the form of mist, and particles made by contamination by IPA are detected on the surface of the semiconductor wafer.

It is noted from these results that, when the initial spray amount of IPA vapor blown onto the semiconductor wafer is within the range from 0.8 cc/s to 1.5 cc/s, both the number of particles and the number of water marks on each semiconductor wafer decreases to 20 or less, and a practically sufficient drying capacity is confirmed.

As the third experiment, the Inventor tried dry-processing of semiconductor wafers by using a controlled IPA vapor drying apparatus, like that used in the second experiment, capable of drying about 50 semiconductor wafers simultaneously and changing the used amount of IPA vapor variously, namely, 30 cc/batch, 50 cc/batch, 70 cc/batch, 80 cc/batch, 90 cc/batch, 105 cc/batch, 150 cc/batch and 200 cc/batch, and measured the number of particles and the number of water marks on each semiconductor wafer in each dry-processing. This method of evaluation and critical values for evaluation used in the measurement are the same as those used for measurement of the initial spray value of IPA explained above.

FIG. 8 shows dependency of the number of particles and the number of water marks on each semiconductor wafer thus measured upon the used amount of IPA.

It is noted from FIG. 8 that, in the controlled IPA vapor drying apparatus, when the used amount of IPA is within the range from 50 cc/batch to 200 cc/batch, the number of particles on each semiconductor wafer is 20 or less. It is also noted that, when the used amount of IPA is within the range from 70 cc/batch to 20 cc/batch, the number of water marks on each semiconductor wafer is 20 or less, and when the used amount of IPA is 50 cc/batch, the number of water marks on each semiconductor wafer is approximately 300. When the used amount of IPA is 30 cc/batch or less, the semiconductor wafer after dry-processing remains half-dried, and water marks are detected on the entire surface although no particles is detected. In contrast, when the used amount of IPA is larger than 200 cc/batch, particles made by contamination by IPA are detected on the surface of the semiconductor wafer.

It is noted from these results that, when the used amount of IPA blown onto the semiconductor wafer is within the range from 70 cc/batch to 200 cc/batch, both the number of particles and the number of water marks on each semiconductor wafer decreases to 20 or less, and a practically sufficient drying capacity is confirmed.

As the fourth experiment, the Inventor tried dry-processing of semiconductor wafers by using a controlled IPA vapor drying apparatus capable of drying about 50 semiconductor wafers simultaneously and changing the number of nozzles for spraying IPA vapors variously, such as two, four and six, and measured the number of water marks on each semiconductor wafer in each dry-processing. This method of evaluation for the measurement is configured to put a dummy semiconductor wafer on a wafer boat, set the semiconductor wafer to be evaluated and perform chemical processing such as DHF (dilute hydrofluoric acid) processing. Critical value used for evaluation is 20 or less for the number of water marks on each semiconductor wafer, which is acceptable for admitting sufficient drying capacity of the drying apparatus.

FIG. 9 shows dependency of the number of water marks on each semiconductor wafer thus measured upon the dry-processing time, reviewing on three different numbers of nozzles, 2, 4 and 6.

It is noted from FIG. 9 that, if the number of water marks is approximately 50 with two nozzles, when four or six nozzles are used, the number of water marks is approximately 10. Although there is some exception, in any dry-processing time, the number water marks under four or six nozzles, is less than the number of water marks under two nozzles. When the number of nozzle is two or less, much dry-processing time is required.

It is noted from these results that, when three or more nozzles are used for blowing IPA vapor onto the semiconductor, the time required for reducing the number of water marks to 20 or less per each semiconductor wafer can be reduced effectively.

The present invention has been made on the basis of these experimental results and researches thereon.

According to the first aspect of the invention, there is provided a drying apparatus for drying a semiconductor substrate configured to dry a semiconductor substrate by evaporating an organic solvent and blowing the evaporated organic solvent onto the semiconductor substrate through a nozzle, comprising:

the evaporate organic solvent being blown onto said semiconductor substrate from a direction aslant by an angle from 20° to 50° from a vertical direction toward the semiconductor substrate.

According to the second aspect of the invention, there is provided a drying apparatus for drying a semiconductor substrate configured to dry a semiconductor substrate by evaporating an organic solvent and blowing the evaporated organic solvent onto the semiconductor substrate through a nozzle, comprising:

the nozzle having a nozzle hole so positioned that a line connecting the center of a cross-sectional plane of the nozzle and the center of the nozzle hole lies between a line connecting the center of the cross-sectional plane of the nozzle and the center of the semiconductor substrate and a tangent drawn from the center of the cross-sectional plane of the nozzle to the semiconductor substrate.

In the first and second aspects of the invention, an even number of nozzles for spraying an organic solvent are provided, and they are located symmetrically with respect to the semiconductor substrate at a level higher than the center of the semiconductor substrate.

According to the third aspect of the invention, there is provided a drying apparatus for drying a semiconductor substrate configured to dry a semiconductor substrate by evaporating an organic solvent and blowing the evaporated organic solvent onto the semiconductor substrate, comprising:

the initial spray amount of the evaporated organic solvent being not less than 0.8 cc/second and not more than 1.5 cc/second.

The drying apparatus for drying a semiconductor substrate according to the third aspect of the invention is suitable for drying approximately 50 semiconductor substrates simultaneously.

In the third aspect of the invention, from the viewpoint of limiting the used amount of the organic solvent while ensuring a sufficient drying capacity, the used amount of the organic solvent used for drying the semiconductor substrate is preferably not less than 70 cc/batch and not more than 200 cc/batch.

According to the fourth aspect of the invention, there is provided a drying apparatus for drying a semiconductor substrate configured to dry a semiconductor substrate by evaporating an organic solvent and blowing the evaporated organic solvent onto the semiconductor substrate, comprising:

the amount of the organic solvent used for drying being not less than 70 cc/batch and not more than 200 cc/batch.

The drying apparatus for drying a semiconductor substrate according to the fourth aspect of the invention is suitable for drying approximately 50 semiconductor substrates simultaneously.

In the fourth aspect of the invention, the initial spray amount of the evaporated organic solvent to be blown on to the semiconductor substrate is preferably not less than 0.8 cc/s and not more than 1.5 cc/s.

In the third and fourth aspects of the invention, the evaporated organic solvent is typically blown onto the semiconductor substrate by using nozzles.

According to the fifth aspect of the invention, there is provided a drying apparatus for drying a semiconductor substrate configured to dry a semiconductor substrate by evaporating an organic solvent and blowing the evaporated organic solvent onto the semiconductor substrate, comprising:

the initial spray amount of the evaporated organic solvent being not less than 0.6 cc/second and not more than 1.5 cc/second.

The drying apparatus for drying a semiconductor substrate according to the fifth aspect of the invention is suitable for drying approximately 25 semiconductor substrates simultaneously.

In the fifth aspect of the invention, the amount of the organic solvent used for drying is preferably not less than 50 cc/batch and not more than 150 cc/batch.

According to the sixth aspect of the invention, there is provided a drying apparatus for drying a semiconductor substrate configured to dry a semiconductor substrate by evaporating an organic solvent and blowing the evaporated organic solvent onto the semiconductor substrate, comprising:

the amount of the organic solvent used for drying being not less than 50 cc/batch and not more than 150 cc/batch.

The drying apparatus for drying a semiconductor substrate according to the sixth aspect of the invention is suitable for drying approximately 25 semiconductor substrates simultaneously.

In the sixth aspect of the invention, from the viewpoint of limiting the used amount of the organic solvent while ensuring a sufficient drying capacity, the initial spray amount of the organic solvent blown onto the semiconductor substrate is preferably not less than 0.6 cc/s and not more than 1.5 cc/s.

According to the seventh aspect of the invention, there is provided a drying apparatus for drying a semiconductor substrate configured to dry a semiconductor substrate by evaporating an organic solvent and blowing the evaporated organic solvent onto the semiconductor substrate through a nozzle, comprising:

three or more of the nozzles being provided.

In the seventh aspect of the invention, for the purpose of efficiently blowing evaporated organic solvent onto the entire surface of the semiconductor substrate, the semiconductor substrate is typically set to orient its surface substantially vertical, and for the purpose of efficiently blowing the evaporated organic solvent to a lower part of the semiconductor substrate held vertically, the nozzle hole of at least one of three nozzles is located at a level lower than the lower end of the semiconductor substrate while it is dried.

In the seventh aspect of the invention, in order to more efficiently blow the evaporated organic solvent onto a lower part of the semiconductor substrate set to orient its surface substantially vertical of the nozzle, the nozzle hole of the nozzle located at a level lower than the semiconductor substrate is typically positioned such that, while the semiconductor substrate is dried, the straight line connecting the center of a cross-sectional plane of the nozzle and the center of the nozzle hole lies between the horizontal direction and the straight line connecting the center of the cross-sectional plane of the nozzle and the lowest portion of the semiconductor substrate. Additionally, in the seventh aspect of the invention, in order to more efficiently blow the evaporated organic solvent onto a lower part of the semiconductor substrate which is set to orient its surface substantially vertical of the nozzle, the nozzle hole of the nozzle located at a level lower than the semiconductor substrate is typically positioned so that, while the semiconductor is dried, a straight line connecting the center of a cross-sectional plane of the nozzle and the center of the nozzle hole lies within the range of angles from 0° to 45° from the horizontal direction toward the semiconductor substrate.

In the seventh aspect of the invention, in order to efficiently blow the evaporated organic solvent onto the entire surface of the semiconductor substrate, four nozzles are typically provided, and two of these four nozzles are located above the center of the semiconductor substrate symmetrically with respect to the semiconductor substrate whilst the other two nozzles are located symmetrically with respect to the semiconductor substrate at a level lower than the lower end of the semiconductor substrate.

According to the eighth aspect of the invention, there is provided a method for drying a semiconductor substrate configured to dry a semiconductor substrate by evaporating an organic solvent and blowing the evaporated organic solvent onto the semiconductor substrate through a nozzle, comprising:

the evaporate organic solvent being blown onto the semiconductor substrate from a direction aslant by an angle from 20° to 50° from a vertical direction toward the semiconductor substrate.

According to the ninth aspect of the invention, there is provided a method for drying a semiconductor substrate configured to dry a semiconductor substrate by evaporating an organic solvent and blowing the evaporated organic solvent onto the semiconductor substrate through a nozzle, comprising:

the nozzle having a nozzle hole so positioned that a line connecting the center of a cross-sectional plane of the nozzle and the center of the nozzle hole lies between a line connecting the center of the cross-sectional plane of the nozzle and the center of the semiconductor substrate and a tangent drawn from the center of the cross-sectional plane of the nozzle to the semiconductor substrate.

In the eighth and ninth aspects of the invention, when the evaporated organic solvent is blown onto the semiconductor substrate through an even number of nozzles, these nozzles are typically positioned symmetrically with respect to the semiconductor substrate at a level higher than the center of the semiconductor substrate.

According to the tenth aspect of the invention, there is provided a method for drying a semiconductor substrate configured to dry a semiconductor substrate by evaporating an organic solvent and blowing the evaporated organic solvent onto the semiconductor substrate, comprising:

the initial spray amount of said evaporated organic solvent being not less than 0.8 cc/second and not more than 1.5 cc/second.

The drying apparatus for drying a semiconductor according to the tenth aspect of the invention is suitable for drying approximately 50 semiconductor substrates simultaneously.

In the tenth aspect of the intention, in order to limit the used amount of the organic solvent while ensuring sufficient drying capacity, the amount of the organic solvent used for drying the semiconductor substrate is preferably not less than 70 cc/batch and not more than 200 cc/batch.

According to the eleventh aspect of the invention, there is provided a method for drying a semiconductor substrate configured to dry a semiconductor substrate by evaporating an organic solvent and blowing the evaporated organic solvent onto the semiconductor substrate, comprising:

the amount of the organic solvent used for drying being not less than 70 cc/batch and not more than 200 cc/batch.

The method for drying a semiconductor substrate according to the eleventh aspect of the invention is suitable for drying approximately 50 semiconductor substrates simultaneously.

In the eleventh aspect of the invention, the initial spray amount of the evaporated organic solvent blown onto the semiconductor substrate is preferably not less than 0.8 cc/s and not more than 1.5 cc/s.

In these tenth and eleventh aspects of the invention, the evaporated organic solvent is typically blown onto the semiconductor substrate by using a nozzle.

According to the twelfth aspect of the intention, there is provided a method for drying a semiconductor substrate configured to dry a semiconductor substrate by evaporating an organic solvent and blowing the evaporated organic solvent onto the semiconductor substrate, comprising:

the initial spray amount of the evaporated organic solvent being not less than 0.6 cc/second and not more than 1.5 cc/second.

The method for drying a semiconductor substrate according to the twelfth aspect of the invention is suitable for drying approximately 25 semiconductor substrates simultaneously.

In the twelfth aspect of the invention, the amount of the organic solvent used for drying is preferably not less than 50 cc/batch and not more than 150 cc/batch.

According to the thirteenth aspect of the invention, there is provided a method for drying a semiconductor substrate configured to dry a semiconductor substrate by evaporating an organic solvent and blowing the evaporated organic solvent onto the semiconductor substrate, comprising:

the amount of the organic solvent used for drying being not less than 50 cc/batch and not more than 150 cc/batch.

The method for drying a semiconductor substrate according to the thirteenth aspect of the invention is suitable for drying approximately 25 semiconductor substrates simultaneously.

In the thirteenth aspect of the invention, in order to limit the used amount of the organic solvent while ensuring sufficient drying capacity, the initial spray amount of the organic solvent used for drying is preferably not less than 0.6 cc/s and not more than 1.5 cc/s.

According to the fourteenth aspect of the invention, there is provided a method for drying a semiconductor substrate configured to dry a semiconductor substrate by evaporating an organic solvent and blowing the evaporated organic solvent onto the semiconductor substrate through a nozzle, comprising:

three or more of the nozzles being provided.

In the fourteenth aspect of the invention, In the seventh aspect of the invention, for the purpose of efficiently blowing evaporated organic solvent onto the entire surface of the semiconductor substrate, the semiconductor substrate is typically set to orient its surface substantially vertical, and for the purpose of efficiently blowing the evaporated organic solvent to a lower part of the semiconductor substrate held vertically, the nozzle hole of at least one of three nozzles is located at a level lower than the lower end of the semiconductor substrate while it is dried.

In the fourteenth aspect of the invention, in order to more efficiently blow the evaporated organic solvent onto a lower part of the semiconductor substrate set to orient its surface substantially vertical of the nozzle, the nozzle hole of the nozzle located at a level lower than the semiconductor substrate is typically positioned such that, while the semiconductor substrate is dried, the straight line connecting the center of a cross-sectional plane of the nozzle and the center of the nozzle hole lies between the horizontal direction and the straight line connecting the center of the cross-sectional plane of the nozzle and the lowest portion of the semiconductor substrate. Additionally, in the fourteenth aspect of the invention, in order to more efficiently blow the evaporated organic solvent onto a lower part of the semiconductor substrate which is set to orient its surface substantially vertical of the nozzle, the nozzle hole of the nozzle located at a level lower than the semiconductor substrate is typically positioned so that, while the semiconductor is dried, a straight line connecting the center of a cross-sectional plane of the nozzle and the center of the nozzle hole lies within the range of angles from 0° to 45° from the horizontal direction toward the semiconductor substrate.

In the fourteenth aspect of the invention, in order to efficiently blow the evaporated organic solvent onto the entire surface of the semiconductor substrate, four nozzles are typically provided, and two of these four nozzles are located above the center of the semiconductor substrate symmetrically with respect to the semiconductor substrate whilst the other two nozzles are located symmetrically with respect to the semiconductor substrate at a level lower than the lower end of the semiconductor substrate.

In the present invention, the carrier gas of the evaporated organic solvent is typically an inactive gas such as $N_2$ gas or argon (Ar) gas, for example.

In the present invention, the organic solvent is typically isopropyl alcohol (IPA), but any appropriate organic solvent other than IPA is usable.

The first and eighth aspects of the invention can efficiently bring the evaporated organic solvent into contact with the semiconductor substrate and can effectively replace water on the surface of the semiconductor by the organic solvent by spraying the evaporated organic solvent from a vertical direction toward the semiconductor substrate by an angle in the range from 20° to 50°. Therefore, the semiconductor substrate can be efficiently dried without increasing water marks or particles on the surface of the semiconductor substrate.

The second and ninth aspects of the invention can bring the organic solvent into reliable contact with the semiconductor substrate and effectively displace water on the surface of the semiconductor substrate, by spraying the organic solvent from the nozzle holes so positioned that the straight line connecting the center of a cross-sectional plane of the nozzle and the center of the nozzle hole lies between the line connecting the center of the cross-sectional plane of the nozzle and the center of the semiconductor substrate and the tangent drawn from the center of the cross-sectional plane of the nozzle to the semiconductor substrate. Therefore, the semiconductor substrate can be efficiently dried without increasing water marks or particles on the surface of the semiconductor substrate.

The third and tenth aspects of the invention can cover and replace water on the surface of the semiconductor substrate with the organic solvent at the initial stage of the dry-processing by setting the initial spray amount of the evaporated organic solvent blown onto the semiconductor substrate to not less than 0.8 cc/sec. and not more than 1.5 cc/sec. Therefore, the semiconductor substrate can be efficiently dried without increasing water marks or particles on the surface of the semiconductor substrate.

The fourth and eleventh aspects of the invention can dry the semiconductor substrate by using the minimum necessary amount of the organic solvent by limiting the amount of the organic solvent used for drying the semiconductor substrate to not less than 70 cc/batch and not more than 200 cc/batch. Therefore, the semiconductor substrate can be efficiently dried without increasing water marks or particles on the surface of the semiconductor substrate.

The fifth and twelfth aspects of the invention can cover and replace water on the surface of the semiconductor substrate with the organic solvent at the initial stage of the dry-processing by setting the initial spray amount of the evaporated organic solvent blown onto the semiconductor substrate to not less than 0.6 cc/sec. and not more than 1.5 cc/sec. Therefore, the semiconductor substrate can be efficiently dried without increasing water marks or particles on the surface of the semiconductor substrate.

The sixth and thirteenth aspects of the invention can dry the semiconductor substrate by using the minimum necessary amount of the organic solvent by limiting the amount of the organic solvent used for drying the semiconductor substrate to not less than 50 cc/batch and not more than 150 cc/batch. Therefore, the semiconductor substrate can be efficiently dried without increasing water marks or particles on the surface of the semiconductor substrate.

The seventh and fourteenth aspects of the invention can blow the evaporated organic solvent onto the surface of the semiconductor substrate from three or more different directions by providing three or more nozzles for spraying the evaporated organic solvent onto the substrate. Therefore, it is ensured to efficiently blow the evaporated organic solvent onto the surface of the semiconductor substrate and to efficiently replace water on the surface of the semiconductor substrate after rinsing with the organic solvent thereby to reduce the drying time.

The above, and other, objects, features and advantage of the present invention will become readily apparent from the following detailed description thereof which is to be read in connection with the accompanying drawings.

BRIEF DESCRIPTION OF THE DRAWINGS

FIGS. 5A through 5D are schematic diagrams for explaining a conventional method for drying semiconductor wafer by using a conventional controlled IPA vapor drying apparatus;

FIG. 14 is a table showing dependency of the number of particles remaining on the semiconductor wafer surface upon the used amount of IPA;

FIG. 15 is a table showing dependency of the number of water marks on the semiconductor wafer surface upon the used amount of IPA;

DETAILED DESCRIPTION OF THE PREFERRED EMBODIMENTS

Figure 1:
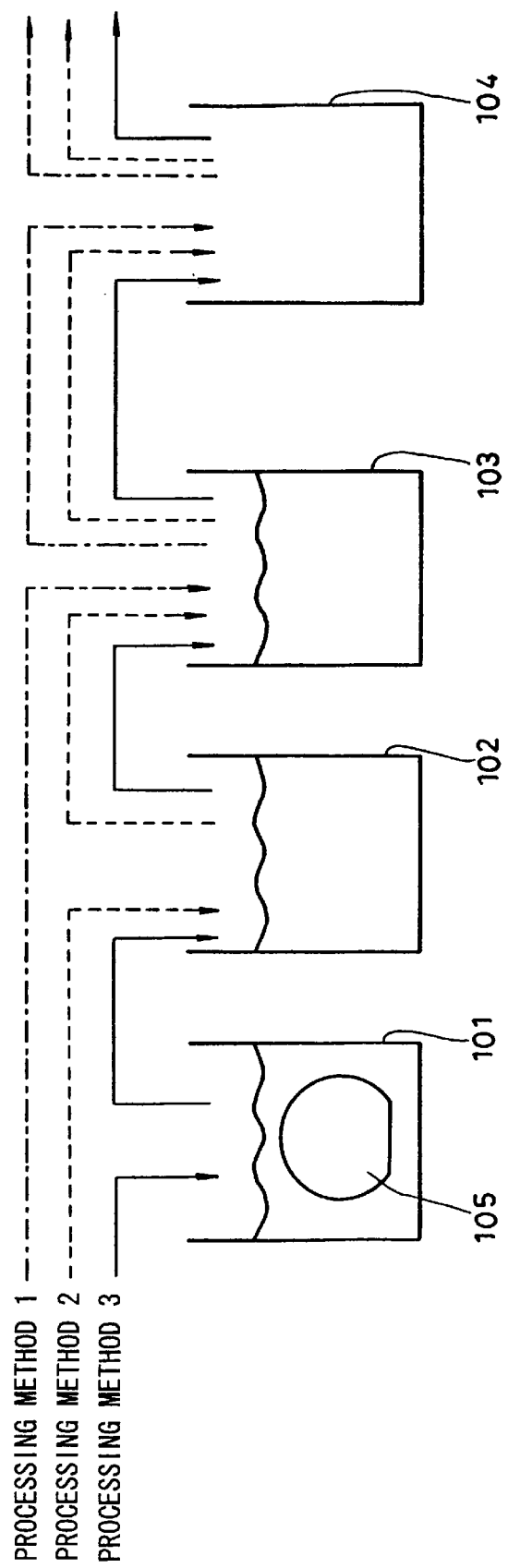
FIG. 1 is a schematic diagram showing construction of a conventional rinse machine for semiconductor wafers.
Figure 2:
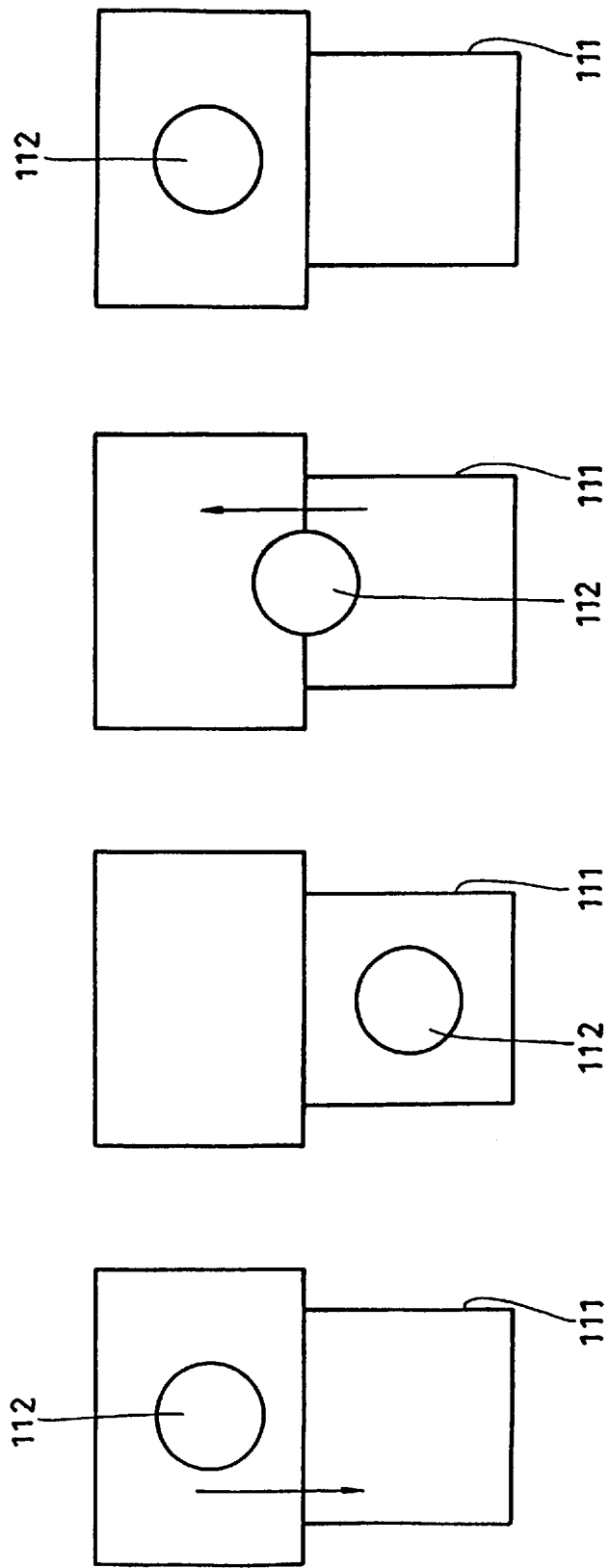
FIGS. 2A through 2D are schematic diagrams for explaining a conventional method for drying semiconductor wafers by using a conventional IPA vapor drying apparatus.
Figure 3:
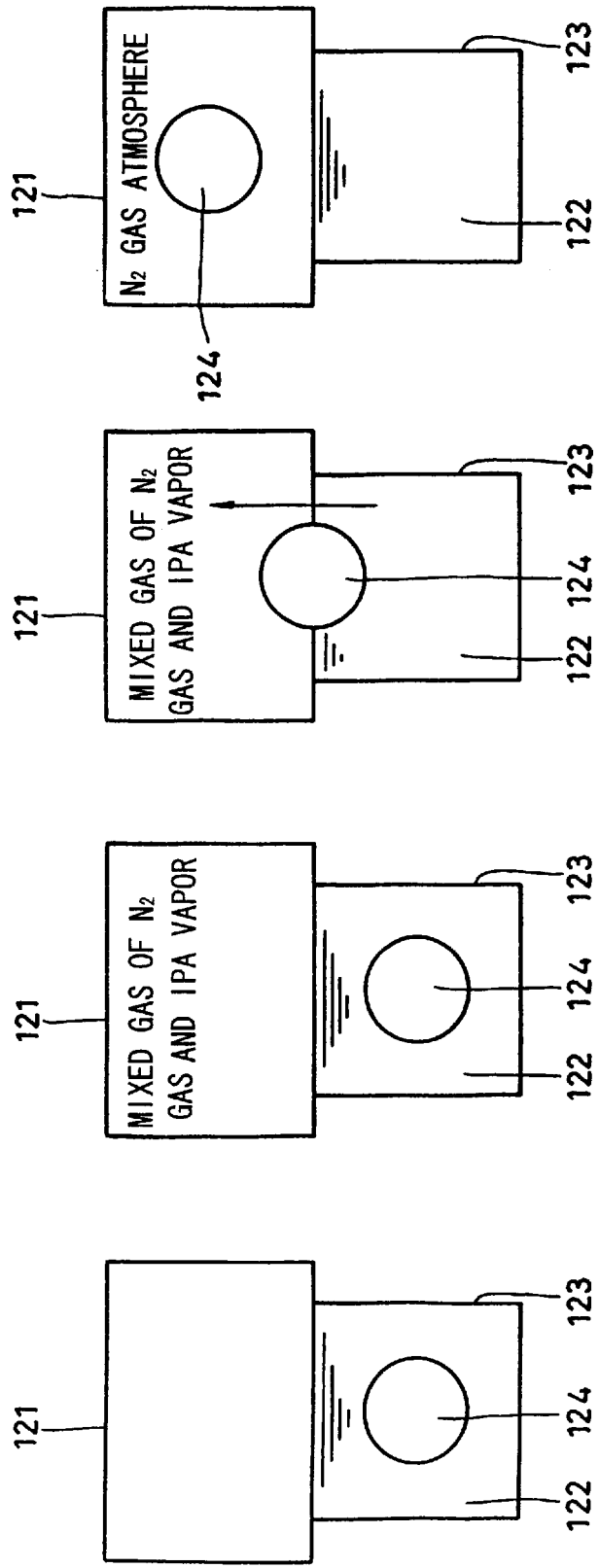
FIGS. 3A through 3D are schematic diagrams for explaining a conventional method for drying semiconductor wafers by using a conventional drying apparatus utilizing the Marangoni effect.
Figure 4:
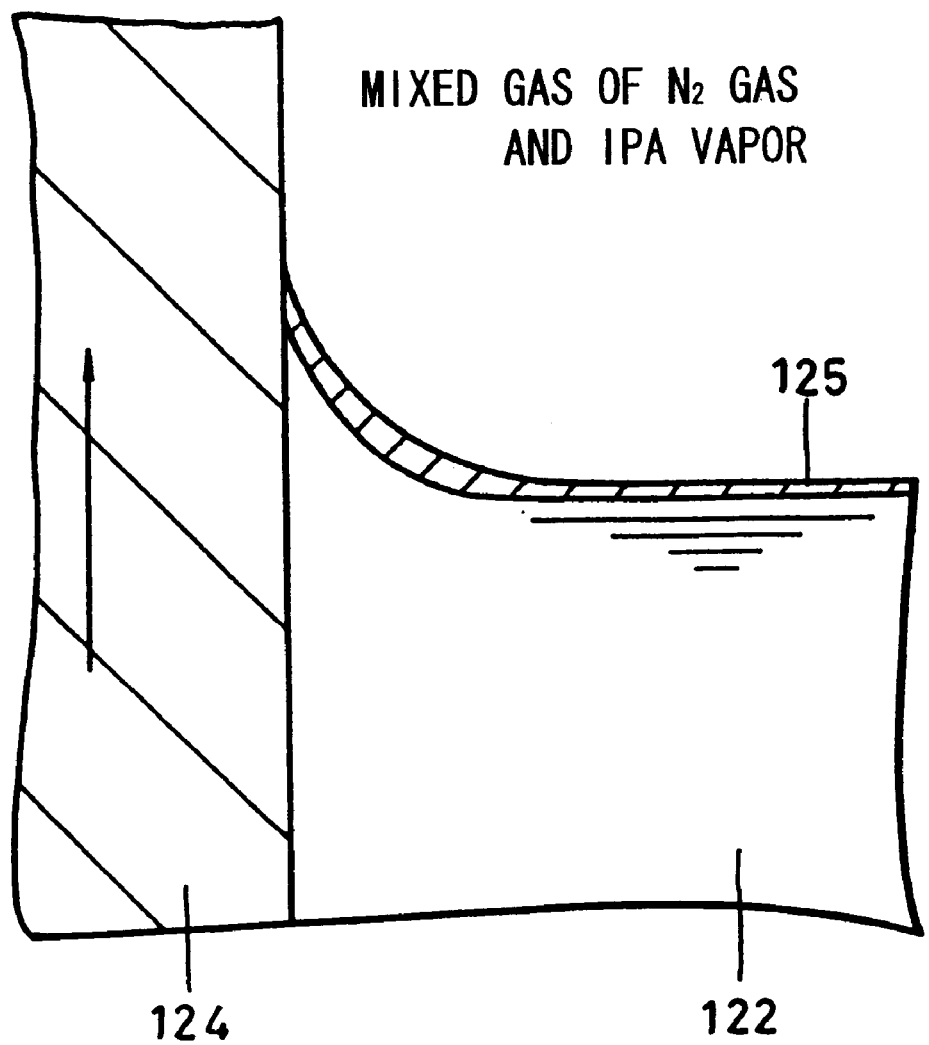
FIG. 4 is a cross-sectional view for explaining the Marangoni effect.
Figure 6:
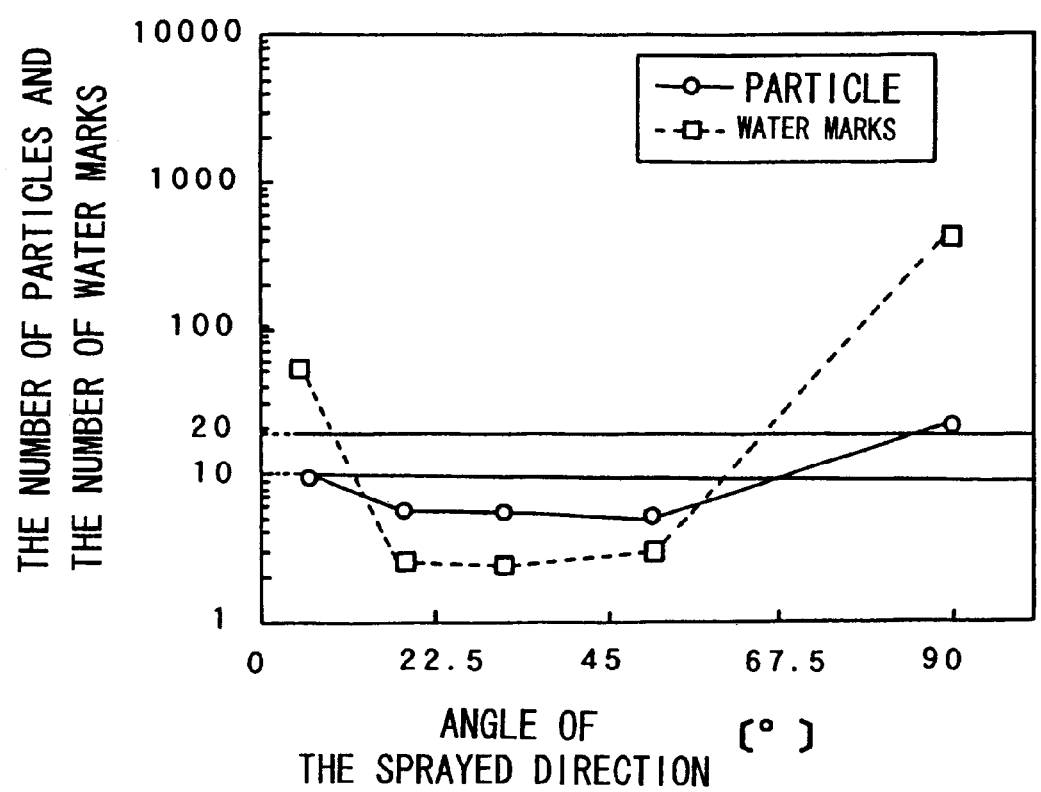
FIG. 6 is a graph showing dependency of the number of particles and the number of water marks on the surface of each semiconductor wafer upon the angle of the spray direction of IPA.
Figure 7:
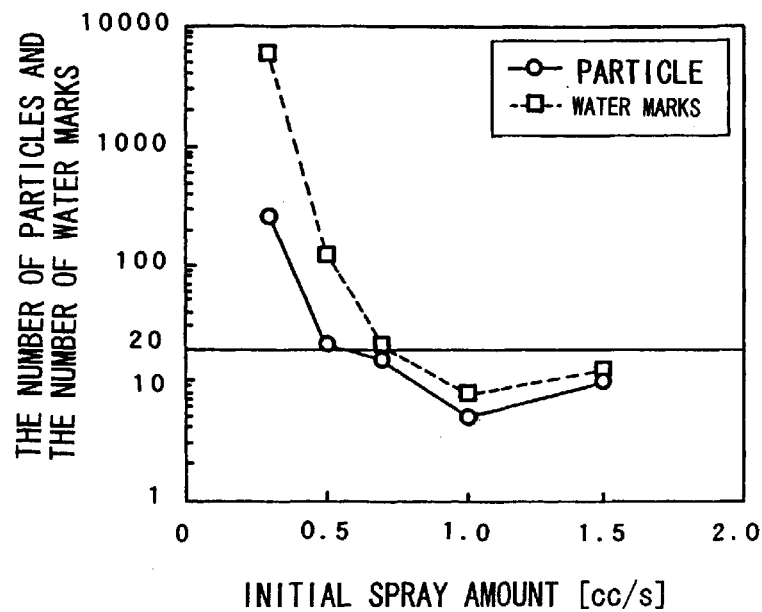
FIG. 7 is a graph showing dependency of the number of particles and the number of water marks on the surface of each semiconductor wafer upon the initial spray amount of IPA.
Figure 8:
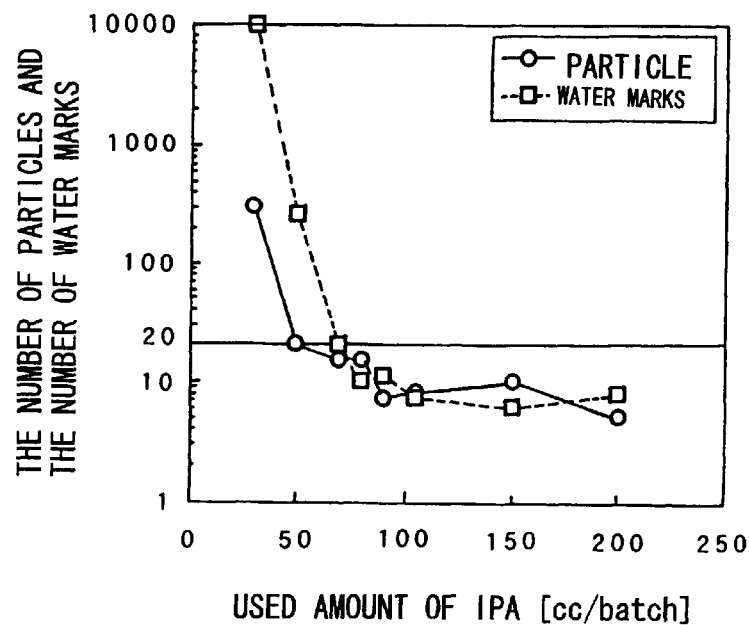
FIG. 8 is a graph showing dependency of the number of particles and the number of water marks on the surface of each semiconductor wafer upon the used amount of IPA.
Figure 9:
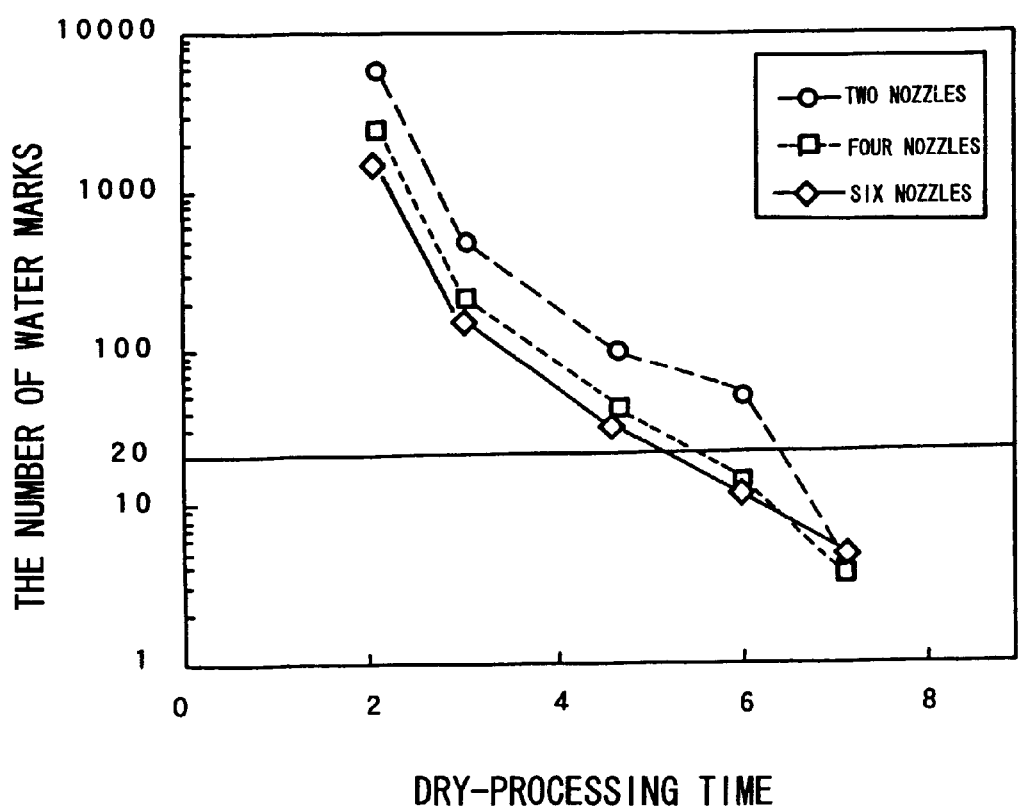
FIG. 9 is a graph showing dependency of the number of water marks on the surface of each semiconductor wafer upon the dry-processing time when IPA is sprayed from two nozzles, four nozzles and six nozzles.

Explained below are some embodiments of the invention with reference to the drawings. In all of the drawings showing the embodiments, identical or equivalent components are labeled with common reference numerals.

Figure 10:
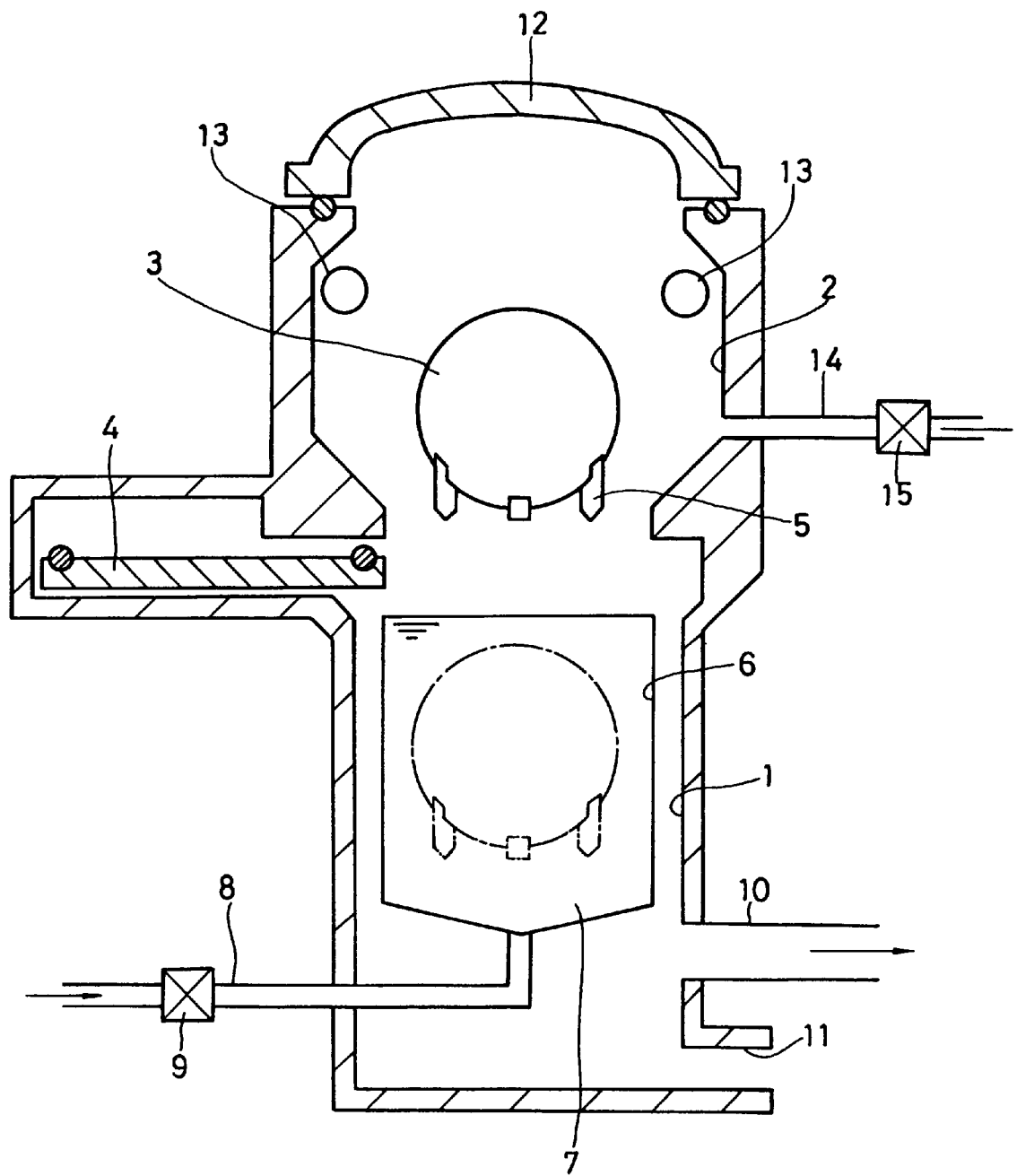
FIG. 10 is a cross-sectional view showing a controlled IPA vapor drying apparatus according to the first embodiment of the invention.
Figure 11:
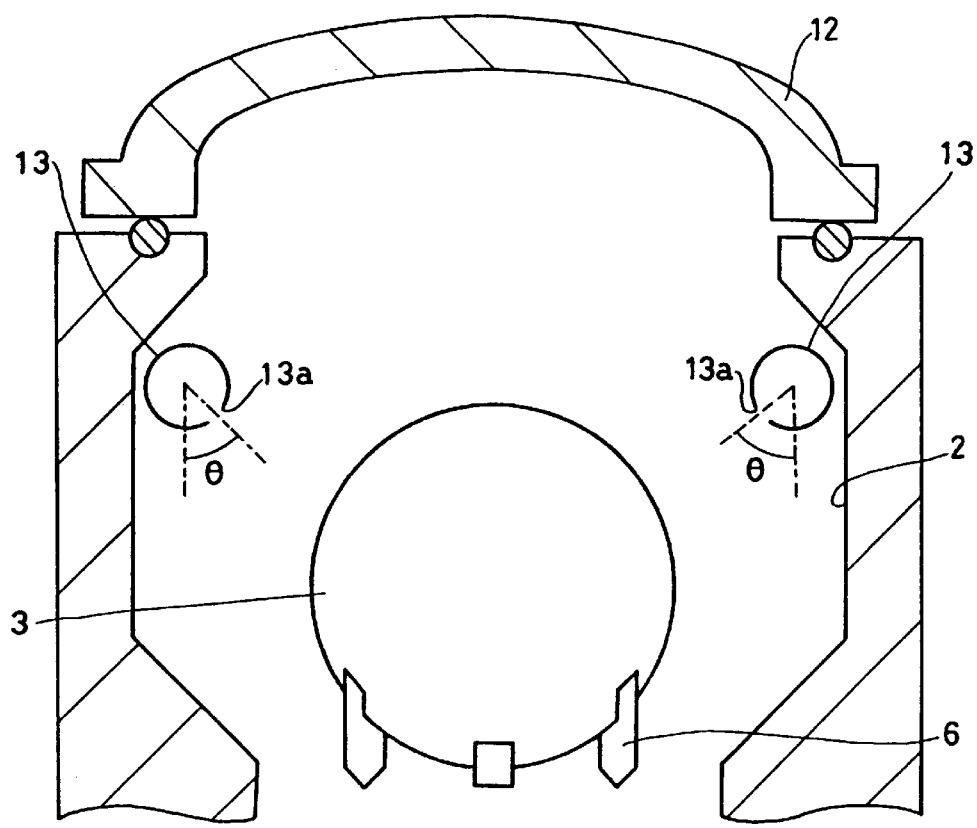
FIG. 11 is a cross-sectional view of a central part of a dry chamber in the controlled IPA vapor drying apparatus according to the first embodiment of the invention.

First explained is a controlled IPA vapor drying apparatus according to the first embodiment of the invention. FIG. 10 shows the controlled IPA vapor drying apparatus according to the first embodiment, and FIG. 11 shows a central part of a dry chamber in the controlled IPA vapor drying apparatus.

As shown in FIG. 10, the controlled IPA vapor drying apparatus according to the first embodiment includes a rinse chamber 1 and a dry chamber 2. The rinse chamber 1 is used for rinse-processing of a semiconductor wafer 3. The dry chamber 2 is used for dry-processing of the semiconductor wafer 3 after rinse-processing, and it is made of a resin material such as Teflon, for example. The height of the dry chamber 2 is approximately 320 mm, for example, when the diameter of the semiconductor wafer 3 is 8 inches. Interposed between the rinse chamber 1 and the dry chamber 2 is a bottom cover 4. The bottom cover 4 is configured to move into below the dry chamber 2 and close an opening at the bottom of the dry chamber 2 thereby to separate the rinse chamber 1 from the dry chamber 2. Therefore, it is movable at least in the horizontal direction. A z-axis guide 5 is provided inside the rinse chamber 1 and the dry chamber 2. The z-axis guide 5 is used to hold approximately 50 semiconductor wafers 3, for example, and transport them between the rinse chamber 1 and the dry chamber 2. thus, it is movable at least upward and downward.

The rinse chamber 1 contains an overflow rinse chamber 6. The overflow rinse chamber 6 can be filled with ultrapure water 7, and a ultrapure water supply pipe 8 is connected to the bottom thereof. The overflow rinse chamber 6 is provided to make ultrapure water 7 overflow to thereby rinse the semiconductor wafer 3. The ultrapure water supply pipe 8 supplies the ultrapure water 7 into the overflow rinse chamber 6. A valve 9 is interposed in the ultrapure water supply pipe 8 to adjust the supply of the ultrapure water 7. A ultrapure water discharge pipe 10 extends from a side wall of the rinse chamber 1, and a drain 11 is provided at the lower end of the side wall.

The dry chamber 2 has a top cover 12 at the top thereof to be opened and closed when the semiconductor wafer 3 is externally moved from the dry chamber 2 or introduced into the dry chamber 2 from the exterior. Provided in the dry chamber 2 are two tubular nozzles 13 in parallel with each other. These two nozzles 13 are located with a distance large enough to permit the semiconductor wafer 3 to pass through between these nozzles 13 when the semiconductor wafer 3 is transported to the exterior from the dry chamber 2 or into the dry chamber 2 from the exterior. More specifically, when the diameter of the semiconductor wafer 3 is 8 inches, these two nozzles 13 are distant by 300 mm or more, for example. As shown in FIG. 11, each nozzle 13 has 50 to 57 nozzle holes 13a along its lengthwise direction (in the direction vertical to the drawing sheet) to spray an inactive gas such as $N_2$ gas or mixed gas of $N_2$ and IPA vapor from individual nozzle holes 13a. Diameter of each nozzle hole 13a is 0.8 mm to 1.0 mm, and concretely, it is 0.8 mm, for example. Nozzle holes 13a are positioned so that the line connecting the center of the nozzle hole 13a and a cross-sectional plane of the nozzle 13 vertical in the lengthwise direction thereof makes an angle $\theta$ within the range of 20° to 50° with reference to the vertical downward direction, and the angle $\theta$ is 41.7°, for example. That is, mixed gas of $N_2$ and IPA vapor is sprayed through the nozzle holes 13a in a direction making and angle of 20° to 50° relative to the vertical downward direction, and in an example, in the direction angled by 41.7° from the vertical downward direction. Defined as the angle $\theta$ is a positive angle from the vertical downward direction toward the semiconductor wafer 3.

A gas discharge pipe 14 extends from a side wall of the dry chamber 2. The gas discharge pipe 14 is provided to externally discharge the gas in side the dry chamber 2. A valve 15 is interposed in the gas discharge pipe 14 to control the discharge of the gas.

Next explained is a method for drying a semiconductor wafer using the controlled IPA vapor drying apparatus explained above.

The z-axis guide 5 is first moved into inside the dry chamber 2, and the top cover 12 is opened. Then, 50 semiconductor wafers 3, for example, are transported onto the z-axis guide 5 and set thereon. Thereafter, the top cover 12 is closed. Next, the z-axis guide 5 is moved downward to transport the semiconductor wafers 3 into the overflow rinse chamber 6 in the rinse chamber 1.

After that, a sufficient amount of ultrapure water 7 is supplied into the overflow rinse chamber 6 through the ultrapure water supply pipe 8 to rinse the semiconductor wafers 3. On the other hand, $N_2$ gas, for example is introduced from the nozzles 13 into the dry chamber 2 to make a $N_2$ gas atmosphere in the dry chamber 2.

After rinse-processing of the semiconductor wafers 3 and establishing the $N_2$ gas atmosphere in the dry chamber 2, the z-axis guide 5 supporting the semiconductor wafers 3 is moved upward to transport the semiconductor wafers into the dry chamber 2. After completion of the transport of the semiconductor wafers 3 into the dry chamber 2, the bottom cover 4 is moved to the bottom of the dry chamber 2 to shut the bottom opening of the dry chamber 2 and separate it from the rinse chamber 1.

Thereafter, using $N_2$ gas as the carrier gas, evaporated IPA is blown onto the semiconductor wafers 3 from the nozzles 13. IPA vapor blown onto the semiconductor wafers 3 once flows onto the bottom inside the dry chamber 2, then rises, and contacts surfaces of the semiconductor wafers 3 during its rising movement to displace water on the surfaces. The replaced IPA automatically vaporizes from the surfaces of the semiconductor wafers 3, and dry-processing of the semiconductor wafers 3 is completed. Conditions for drying the semiconductor wafers 3 are: 0.8 cc/s through 1.5 cc/s as the initial spray amount of IPA vapor, and 70 cc/batch through 200 cc/batch as the used amount thereof. More specifically, setting the initial spray amount of IPA vapor to 0.8 cc/s and maintaining the spray amount constant, it is blown onto the semiconductor wafers 3 for approximately 105 seconds, for example. In this case, the used amount of IPA is approximately 84 cc. These initial spray amount and used amount of IPA vapor are defined in liquid phase volume of IPA.

After that, the top cover 12 of the dry chamber 2 is opened, and the semiconductor wafers 3 are transported externally, thus completing the dry processing.

Figure 12:
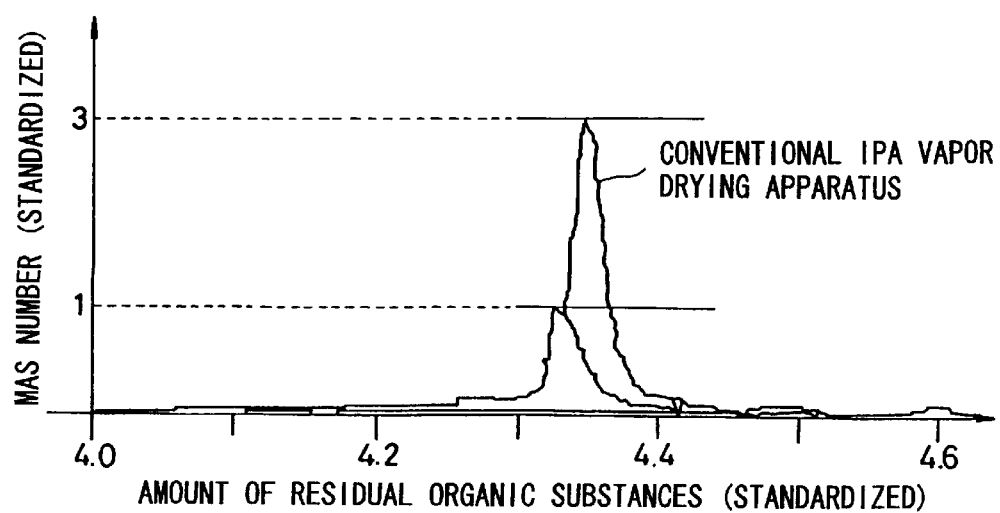
FIG. 12 is a graph showing amounts of residual organic substances on semiconductor wafer surfaces.

FIG. 12 shows measured values of the amount of residual organic substances on semiconductor wafers on each mass number for the case of using the conventional IPA vapor drying apparatus to dry the semiconductor wafers and for the case using the controlled IPA vapor drying apparatus according to the first embodiment to dry the semiconductor wafers. Semiconductor wafers used here are 8-inches silicon wafers. Both the mass numbers and amounts of the residual substances are standardized.

It is noted from FIG. 12 that the amount of residual organic substances on semiconductor wafers dried by the controlled IPA vapor drying apparatus according to the first embodiment is decreased to approximately ⅓ of the amount of residual substances on semiconductor wafers dried by the conventional IPA vapor drying apparatus.

As explained above, according to the first embodiment, by providing the nozzles 13 (FIG. 10) so that the line connecting the center of a cross-sectional plane thereof vertical to the lengthwise direction thereof and the center of each nozzle 13a is slanted by an angle within 20° to 50° from the vertical downward direction toward the semiconductor wafers 3, IPA vapor can be efficiently blown onto the semiconductor wafers 3, which contributes to reducing the dry-processing time while ensuring a drying capacity equivalent to that of the conventional IPA vapor drying apparatus and to reducing the used amount of IPA. Therefore, embodiment can improve the processing capacity of a rinse machine including the IPA vapor drying apparatus, and can prevent adverse affection to the natural environment. Moreover, since the amount of residual organic substances can be reduced to approximately ⅓ of the amount of residual substances by dry-processing using the conventional IPA vapor drying apparatus, the embodiment can reduce deterioration of characteristics of a semiconductor device made on the semiconductor wafer 3 due to residual organic substances.

Next explained is a controlled IPA vapor drying apparatus according to the second embodiment of the invention.

Figure 13:
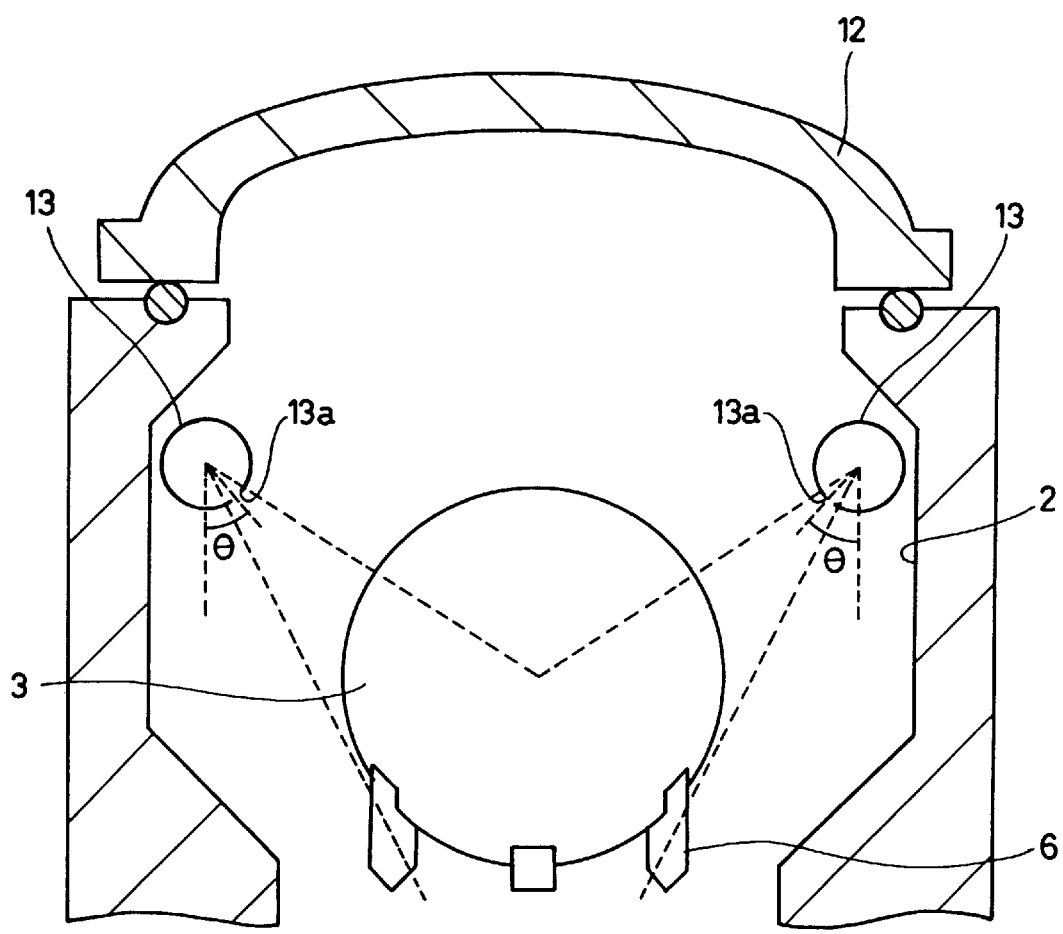
FIG. 13 is a cross-sectional view showing a central part of a dry chamber in a controlled IPA vapor drying apparatus as a modified version according to the first embodiment of the invention.

As shown in FIG. 13, in the controlled IPA vapor drying apparatus according to the second embodiment, the angle $\theta$ is determined so that the line connecting the center of a cross-sectional plane of the nozzle 13 vertical of the lengthwise direction thereof and the center of the nozzle hole 13a lies between the line connecting the center of the cross-sectional plane of the nozzle 13 and the center of the semiconductor wafer 3. In the other respects, the second embodiment is the same as the first embodiment.

The second embodiment also ensures the same effects as those of the first embodiment.

Next explained is a method for drying semiconductor wafers, using a controlled IPA vapor drying apparatus according to the third embodiment of the invention. The controlled IPA vapor drying apparatus according to the third embodiment is the same as that shown in FIG. 10. So, its explanation is omitted.

First as shown in FIG. 10, the z-axis guide 5 is previously moved into the dry chamber 2, and the top cover 12 is opened. Then, 50 semiconductor wafers 3, for example, are transported onto the z-axis guide 5 and put thereon. After that, the top cover 12 is closed. Next, by moving the z-axis guide 5 downward, the semiconductor wafers 3 are transported into the overflow rinse chamber 6 inside the rinse chamber 1.

After that, a sufficient amount of ultrapure water 7 is supplied into the overflow rinse chamber 6 through the ultrapure water supply pipe 8 to rinse the semiconductor wafers 3. On the other hand, $N_2$ gas, for example is introduced from the nozzles 13 into the dry chamber 2 to make a $N_2$ gas atmosphere in the dry chamber 2.

After rinse-processing of the semiconductor wafers 3 and establishing the $N_2$ gas atmosphere in the dry chamber 2, the z-axis guide 5 supporting the semiconductor wafers 3 is moved upward to transport the semiconductor wafers into the dry chamber 2. After completion of the transport of the semiconductor wafers 3 into the dry chamber 2, the bottom cover 4 is moved to the bottom of the dry chamber 2 to shut the bottom opening of the dry chamber 2 and separate it from the rinse chamber 1.

Thereafter, using $N_2$ gas as the carrier gas, evaporated IPA is blown onto the semiconductor wafers 3 from the nozzles 13. For spraying evaporated IPA vapor onto the semiconductor wafers 3, the initial spray amount of IPA vapor is set to 0.8 cc/s through 1.5 cc/s, and the used amount thereof is set to 70 cc/batch through 200 cc/batch. More specifically, setting the initial spray amount of IPA vapor to 0.8 cc/s and maintaining the spray amount constant, it is blown onto the semiconductor wafers 3 for approximately 105 seconds, for example. In this case, the used amount of IPA is approximately 84 cc. As a result, IPA vapor substantially fully replaces water on the surfaces. The replaced IPA automatically vaporizes from the surfaces of the semiconductor wafers 3, and dry-processing of the semiconductor wafers 3 is completed. The initial spray amount and used amount of IPA vapor are defined in liquid phase volume of IPA.

After that, the top cover 12 of the dry chamber 2 is opened, and the semiconductor wafers 3 are transported externally, thus completing the dry processing.

Amounts of residual organic substances on semiconductor wafers after the above-explained dry processing were measured on semiconductor wafers dried by using the conventional IPA vapor drying apparatus and on semiconductors dried by using the IPA vapor drying apparatus according to the third embodiment. As a result, it was confirmed that the amount of residual organic substances on semiconductor wafers dried by using the IPA vapor drying apparatus according to the third embodiment be reduced to approximately ⅓ of the amount of residual organic substances on semiconductor wafers dried by using the conventional IPA vapor drying apparatus.

FIG. 14 shows a result of measurement and evaluation of the number of particles adhering onto each semiconductor wafer when semiconductor wafers were dried under the conditions of the third embodiment by using the above-explained controlled IPA vapor drying apparatus. For reference, here is also shown the result of measurement of the number of particles adhering onto each semiconductor wafer when semiconductor wafers were dried under conditions different from those of the third embodiment. When the number of particles adhering onto each semiconductor wafer is more than 20, the mark x is attached. When it is 20 or less, the mark ○ is attached. FIG. 15 shows a result of similar measurement on the number of water marks on each semiconductor wafer surface.

It is noted from FIGS. 14 and 15, when the initial spray amount and the used amount of IPA vapor in the third embodiment are 0.8 cc/s and 84 cc, respectively, both the number of particles and the number of water marks on each semiconductor wafer are 20 or less, which is acceptable for admitting sufficient drying capacity required in a drying apparatus. Thus, it was confirmed that the controlled IPA vapor drying apparatus according to the third embodiment certainly has a sufficient drying capacity.

As explained above, the third embodiment ensures a minimum necessary amount of IPA vapor to be blown in dry processing of semiconductor wafers 3, and the drying time can be reduced while ensuring a drying capacity equivalent to that of the conventional IPA vapor drying apparatus, by setting the initial spray amount of IPA vapor blown onto semiconductor wafers 3 from nozzles 13 in the controller IPA vapor drying apparatus to 0.8 cc/s through 1.5 cc/s and setting the used amount of same to 70 cc/batch through 200 cc/batch. Therefore, the embodiment can improve the processing capacity of a rinse machine including the IPA vapor drying apparatus. Additionally, as compared with the used amount of IPA in the conventional IPA vapor drying apparatus, the embodiment can reduce the used amount thereof, and contributes to reduction of adverse affection to the natural environment. Furthermore, since the amount of residual organic substances can be reduced to approximately ⅓ of the amount of residual organic substances on semiconductor wafers dried by using the conventional IPA vapor drying apparatus, a semiconductor device made on the semiconductor wafer 3 can be prevented from deterioration of characteristics by residual organic substances.

Next explained is a controller IPA vapor drying apparatus according to the fourth embodiment of the invention.

In the controlled IPA vapor drying apparatus according to the fourth embodiment, the z-axis guide 5 is configured to support approximately 25 semiconductor wafers 3, and each nozzle 13 has formed 29 to 57 nozzle holes. In the other respect, the drying apparatus used here is the same as the controlled IPA vapor drying apparatus according to the third embodiment.

A method for drying semiconductor wafers using the controlled IPA vapor drying apparatus according to the fourth embodiment sets the initial spray amount of IPA vapor to 0.6 cc/s through 1.5 cc/s and the used amount thereof to 50 cc/batch through 150 cc/batch. More specifically, the initial spray amount may be 0.6 cc/s, for example, and the used amount may be 50 cc, for example. In the other respects, it is the same as the third embodiment.

The fourth embodiment also ensures the same effects as those of the third embodiment.

Figure 16:
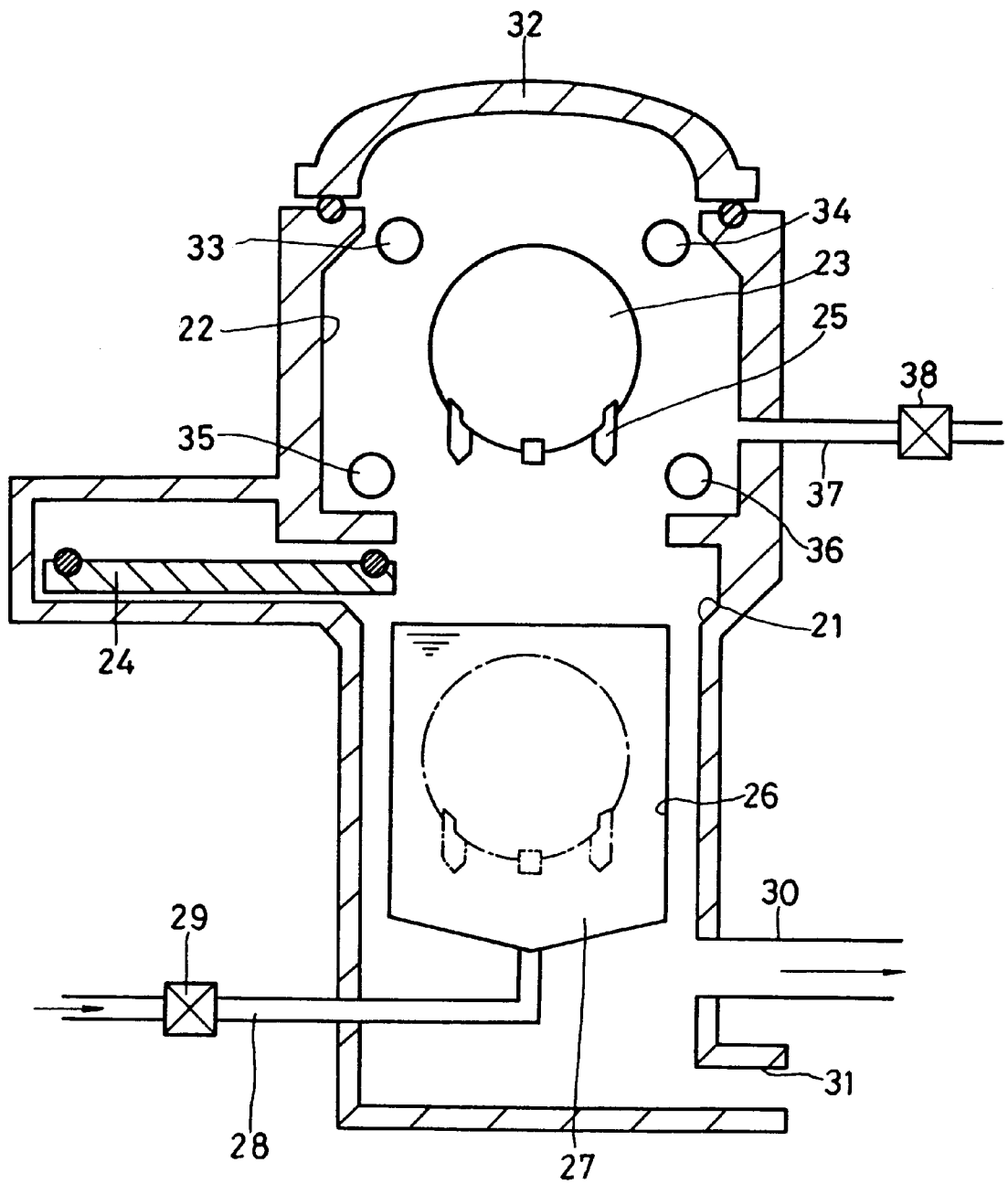
FIG. 16 is a cross-sectional view showing construction of a controlled IPA vapor drying apparatus according to the fifth embodiment of the invention.
Figure 17:
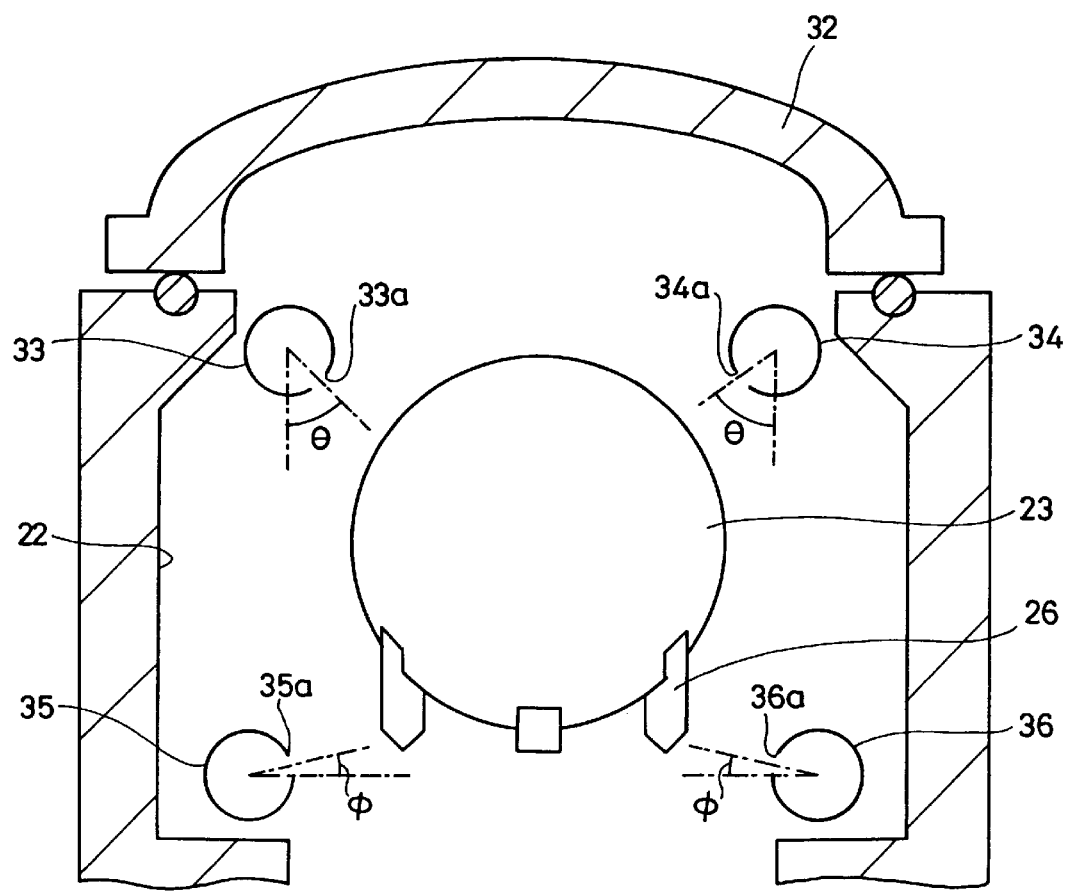
FIG. 17 is a cross-sectional view showing a central part of a dry chamber in the controlled IPA vapor drying apparatus according to the fifth embodiment of the invention.

Next explained is a controlled IPA vapor drying apparatus according to the fifth embodiment of the invention. FIG. 16 shows the controlled IPA vapor drying apparatus according to the fifth embodiment, and FIG. 17 shows a central part of the dry chamber of the controlled IPA vapor drying apparatus.

As shown in FIG. 16, the controlled IPA vapor drying apparatus according to the fifth embodiment includes a rinse chamber 21 and a dry chamber 22. The rinse chamber 21 is used for rinse-processing of a semiconductor wafer 23. The dry chamber 22 is used for dry-processing of the semiconductor wafer 23 after rinse-processing, and it is made of a resin material such as Teflon, for example. The height of the dry chamber 22 is approximately 320 mm, for example, when the diameter of the semiconductor wafer 23 is 8 inches. Interposed between the rinse chamber 21 and the dry chamber 22 is a bottom cover 24. The bottom cover 24 is configured to move into below the dry chamber 22 and close an opening at the bottom of the dry chamber 22 thereby to separate the rinse chamber 21 from the dry chamber 22. Therefore, it is movable at least in the horizontal direction. A z-axis guide 25 is provided inside the rinse chamber 21 and the dry chamber 22. The z-axis guide 25 is used to hold approximately 50 semiconductor wafers 23, for example, and transport them between the rinse chamber 21 and the dry chamber 22. thus, it is movable at least upward and downward.

The rinse chamber 21 contains an overflow rinse chamber 26. The overflow rinse chamber 26 can be filled with ultrapure water 27, and a ultrapure water supply pipe 28 is provided thereunder in connection with overflow rinse chamber 26. The overflow rinse chamber 26 is provided to make ultrapure water overflow to thereby rinse the semiconductor wafer 23. The ultrapure water supply pipe 28 supplies the ultrapure water into the overflow rinse chamber 26. A valve 29 is interposed in the ultrapure water supply pipe 28 to adjust the supply of the ultrapure water. A ultrapure water discharge pipe 30 extends from a side wall of the rinse chamber 21, and a drain 31 is provided at the lower end of the side wall.

The dry chamber 22 has a top cover 32 at the top thereof to be opened and closed when the semiconductor wafer 23 is externally moved from the dry chamber 22 or introduced into the dry chamber 22 from the exterior. Provided in the dry chamber 2 are, for example, four tubular nozzles 33, 34, 35, 36 in parallel with each other. The nozzles 33, 34 of these four nozzles, 33, 34, 35, 36 are located symmetrically with respect to the semiconductor wafer 23 in a level higher than the center of the semiconductor wafer 23, with a distance large enough to permit the semiconductor wafer 23 to pass through between these nozzles 33, 34 when the semiconductor wafer 23 is transported to the exterior from the dry chamber 22 or into the dry chamber 22 from the exterior. More specifically, when the diameter of the semiconductor wafer 23 is 8 inches, these two nozzles 33, 34 are distant by 300 mm or more, for example. The other nozzles 35, 36 are located symmetrically with respect to the semiconductor wafer in a level where their nozzle holes be lower than the lower end of the semiconductor wafer 23, with a distance large enough to permit the semiconductor wafer 23 to pass through between these nozzles 35, 36 when the semiconductor wafer 23 is transported between the dry chamber 22 and the rinse chamber 21. Additionally, as shown in FIG. 17, each nozzle 33, 34, 35, 36 has 50 to 57 nozzle holes 33a, 34a, 35a, 36a along its lengthwise direction (in the direction vertical to the drawing sheet) to spray an inactive gas such as $N_2$ gas or mixed gas of $N_2$ and IPA vapor from individual nozzle holes 33a, 34a, 35a, 36a. Diameter of each nozzle hole 33a, 34a, 35a, 36a is 0.8 mm to 1.0 mm, and concretely, it is 0.8 mm, for example. Nozzle holes 33a, 34a of the nozzles 33, 34 are positioned so that the line connecting the center of the nozzle holes 33a or 34a and a cross-sectional plane of the nozzle 33 or 34 vertical in the lengthwise direction thereof makes an angle θ within the range of 20° to 50° from the vertical downward direction toward the semiconductor wafer 23. On the other and, nozzle holes 35a, 36a of the nozzles 35a, 36 are positioned to make an angle φ so that the line connecting the center of the nozzle holes 35a or 36a and a cross-sectional plane of the nozzle 35 or 36 vertical in the lengthwise direction thereof lies between the horizontal direction and the line connecting the center of the nozzle 35, 36 and the lower end of the semiconductor wafer 23. Defined as the angles θ and φ are positive angles from the vertical downward direction and from the horizontal direction toward the semiconductor wafer 23, respectively.

As shown in FIG. 16, a gas discharge pipe 37 extends from a side wall of the dry chamber 22. The gas discharge pipe 37 is provided to externally discharge the gas in side the dry chamber 22. A valve 38 is interposed in the gas discharge pipe 37 to control the discharge of the gas.

Next explained is a method for drying semiconductor wafers by using the above-explained controlled IPA vapor drying apparatus.

The z-axis guide 25 is first moved into inside the dry chamber 22, and the top cover 32 is opened. Then, 50 semiconductor wafers 23, for example, are transported onto the z-axis guide 25 and set thereon. Thereafter, the top cover 32 is closed. Next, the z-axis guide 25 is moved downward to transport the semiconductor wafers 23 into the overflow rinse chamber 26 in the rinse chamber 21.

After that, a sufficient amount of ultrapure water 27 is supplied into the overflow rinse chamber 26 through the ultrapure water supply pipe 28 to rinse the semiconductor wafers 23. On the other hand, $N_2$ gas, for example is introduced from the nozzles 33, 34, 35, 36 into the dry chamber 22 to make a $N_2$ gas atmosphere in the dry chamber 22.

After rinse-processing of the semiconductor wafers 23 and establishing the $N_2$ gas atmosphere in the dry chamber 22, the z-axis guide 25 supporting the semiconductor wafers 23 is moved upward to transport the semiconductor wafers into the dry chamber 22. After completion of the transport of the semiconductor wafers 23 into the dry chamber 22, the bottom cover 24 is moved to the bottom of the dry chamber 22 to shut the bottom opening of the dry chamber 22 and separate it from the rinse chamber 21.

Thereafter, using $N_2$ gas as the carrier gas, evaporated IPA is blown onto the semiconductor wafers 23 from the nozzles 33, 34, 35, 36 to replace water on surfaces of the semiconductor wafer 23 with IPA vapor. Especially, IPA vapor sprayed from the nozzles 35, 36 rises within the dry chamber 22, and contacts surfaces of the semiconductor wafers 3 during its rising movement to displace water on the surfaces. The replaced IPA automatically vaporizes from the surfaces of the semiconductor wafers 23, and dry-processing of the semiconductor wafers 23 is completed. Conditions for drying the semiconductor wafers 23 are: 110° C., for example, as the temperature of the $N_2$ gas used as the carrier gas, 0.8 cc/s through 1.5 cc/s as the initial spray amount of IPA vapor, and 70 cc/batch through 200 cc/batch as the used amount thereof. More specifically, setting the initial spray amount of IPA vapor to 0.8 cc/s and maintaining the spray amount constant, it is blown onto the semiconductor wafers 23 for approximately 105 seconds, for example. In this case, the used amount of IPA is approximately 84 cc. These initial spray amount and used amount of IPA vapor are defined in liquid phase volume of IPA.

After that, the top cover 32 of the dry chamber 22 is opened, and the semiconductor wafers 23 are transported externally, thus completing the dry processing.

Amounts of residual organic substances on semiconductor wafers after the above-explained dry processing were measured on semiconductor wafers dried by using the conventional IPA vapor drying apparatus and on semiconductors dried by using the IPA vapor drying apparatus according to the fifth embodiment. As a result, it was confirmed that the amount of residual organic substances on semiconductor wafers dried by using the IPA vapor drying apparatus according to the fifth embodiment be reduced to approximately ⅓ of the amount of residual organic substances on semiconductor wafers dried by using the conventional IPA vapor drying apparatus.

As explained above, the IPA vapor drying apparatus and the drying method according to the fifth embodiment can efficiently blow IPA vapor onto semiconductor wafers 23, thereby reduce the drying time while ensuring a drying capacity equivalent to that of the conventional IPA vapor drying apparatus, and reduce the used amount of IPA, by positioning two nozzles 33, 34 in a level higher than the center of the semiconductor wafer 23 in the controlled IPA vapor drying apparatus, and positioning the other two nozzles 35, 36 to position their nozzle holes 35a, 36a in a level lower than the lower end of the semiconductor wafer 23. Therefore, the embodiment can improve the processing capacity of a rinse machine using the IPA vapor drying apparatus, and can prevent adverse affection to the natural environment. Additionally, since the amount of residual organic substances can be reduced to approximately ⅓ of the amount of residual organic substances on semiconductor wafers dried by using the conventional IPA vapor drying apparatus, a semiconductor device made on the semiconductor wafer 23 can be prevented from deterioration of characteristics by residual organic substances.

Next explained is a controlled IPA vapor drying apparatus according to the sixth embodiment of the invention.

In the IPA vapor drying apparatus according to the sixth embodiment, nozzle holes 35a, 36a are positioned such that the angle φ shown in FIG. 17 be 0° to 45°. In the other respects, the drying apparatus according to the sixth embodiment is the same as the controlled IPA vapor drying apparatus according to the fifth embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

The sixth embodiment also ensures the same effects as those of the fifth embodiment.

Additionally, although the first, third and fifth embodiments, for example, are configured to spray IPA vapor onto semiconductor wafers while maintaining the initial spray amount constant, it is acceptable to fix the initial spray amount to value from 0.8 cc/s to 1.5 cc/s and thereafter increase or decrease the spray amount.

Further, although the first and third embodiments, for example, have been explained as establishing an atmosphere using $N_2$ gas as an inactive gas inside the dry chamber 2, Ar gas is also usable. Additionally, in the fifth embodiment, for example, an atmosphere using $N_2$ gas as an inactive gas is made inside the dry chamber 2. However, Ar gas is also usable.

Furthermore, constructions of the apparatuses used in the first and fifth embodiments, for example, are not but examples, and any other appropriate apparatus with construction different from them may be used.

Figure 18:
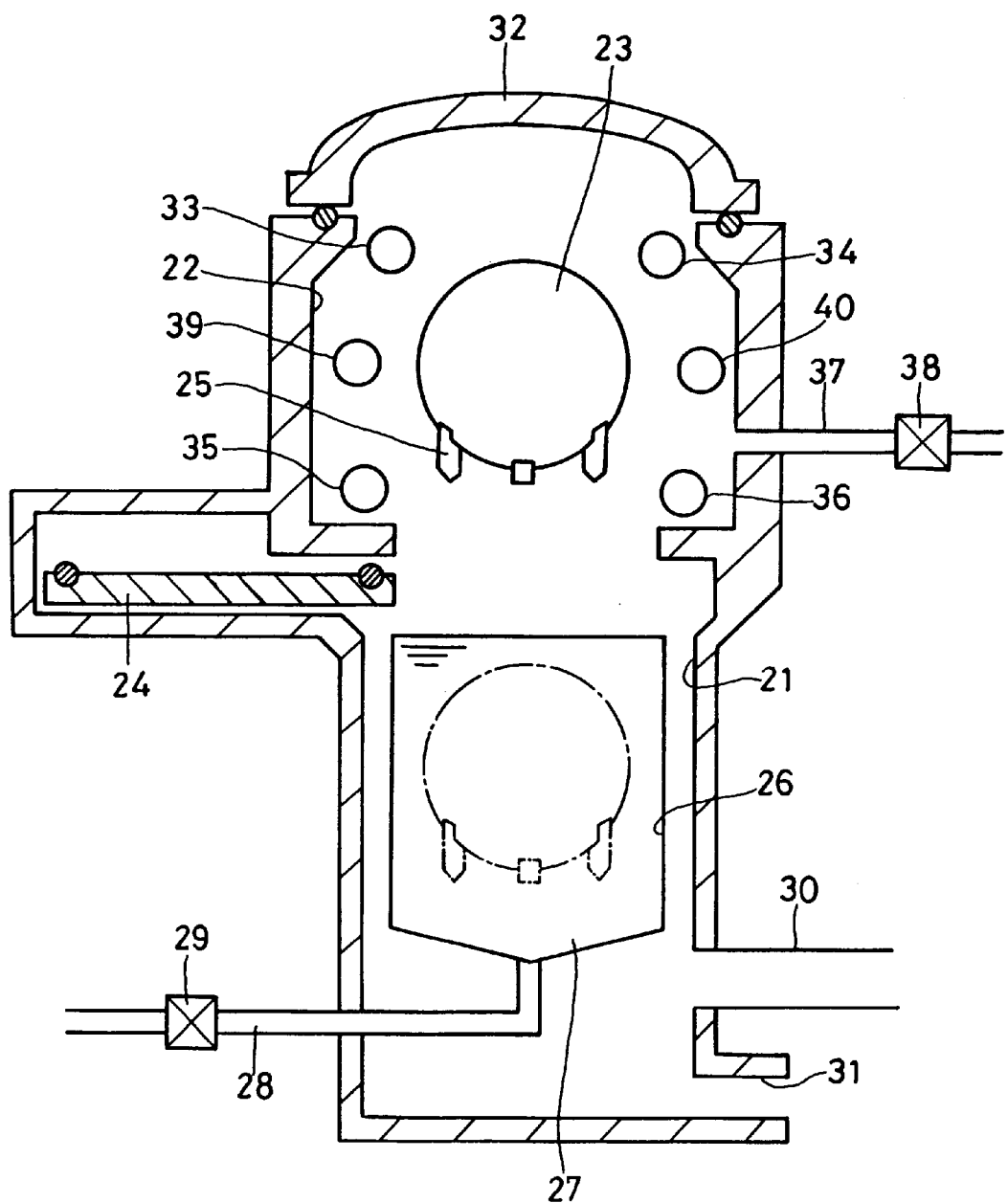
FIG. 18 is a cross-sectional view showing a modified version of the IPA vapor drying apparatus according to the fifth embodiment of the invention.

Moreover, although the fifth embodiment, for example, uses four nozzles, the number of nozzles is not limited to four. Instead, the apparatus may be configured to include six nozzles provided at symmetric left and right positions with respect to the semiconductor wafer 23 as shown in FIG. 18 by positioning additional two nozzles 39, 40 at left and right symmetric locations with respect to the semiconductor wafer 23 at substantially the same height as the center of the semiconductor wafer 23. Alternatively, any other number of nozzles are also usable.

As described above, the first and eighth aspects of the invention can reduce the drying time without inviting a decrease of the drying capacity, thereby improve the dry-precessing capacity and reduce residual organic substances by blowing evaporated organic solvent onto a semiconductor substrate from a direction angled by 20° to 50° from a vertical downward direction toward the semiconductor substrate.

The second and ninth aspects of the invention can reduce the drying time without inviting a decrease of the drying capacity, thereby improve the dry-precessing capacity and reduce residual organic substances by providing nozzle holes of nozzles for spraying organic solvent such that the straight line connecting the center of a cross-sectional plane of the nozzle and the center of the nozzle holes lies between the line connecting the center of the cross-sectional plane of the nozzle and the center of the semiconductor substrate and the tangent drawn from the center of the cross-sectional plane of the nozzle to the semiconductor substrate.

The third, fourth, fifth, sixth, tenth, eleventh, twelfth and thirteenth aspects of the invention can reduce the drying time without inviting a decrease of the drying capacity, thereby improves the dry-precessing capacity and reduce residual organic substances. They can also reduce the used amount of organic substance to a minimum amount required for drying to thereby contribute to protection of the natural environment and reduce residual organic substances.

The seventh and fourteenth aspects of the invention can reduce the drying time without inviting a decrease of the drying capacity, thereby improves the dry-precessing capacity and reduce residual organic substances by using three or more nozzles and by blowing evaporated organic solvent onto a semiconductor substrate from these nozzles.

What is claimed is:

1. A drying apparatus for drying a semiconductor substrate, said drying apparatus comprising:
    evaporated organic solvent; and
    a nozzle through which said evaporated organic solvent is blown onto said semiconductor substrate from a direction at an angle of 20° to 50° from a vertical direction which is parallel to a primary planar surface of said semiconductor substrate, in a direction toward said semiconductor substrate.

2. The drying apparatus for drying a semiconductor substrate according to claim 1 wherein said organic solvent is isopropyl alcohol.

3. The drying apparatus for drying a semiconductor substrate according to claim 1 wherein an inactive gas is used as a carrier gas of said evaporated organic solvent.

4. The drying apparatus for drying a semiconductor substrate according to claim 1 wherein an even number of said nozzles are provided and located symmetrically with respect to said semiconductor substrate in a level higher than the center of semiconductor substrate.

5. A drying apparatus for drying a semiconductor substrate, said drying apparatus comprising:
    evaporated organic solvent; and
    a nozzle through which said evaporated organic solvent is blown onto said semiconductor substrate, said nozzle having a nozzle hole so positioned that a line connecting a center of a cross-sectional plane of said nozzle and a center of said nozzle hole lies between a line connecting said center of the cross-sectional plane of said nozzle and the center of said semiconductor substrate and a tangent drawn from said center of the cross-sectional plane of said nozzle to said semiconductor substrate.

6. A drying apparatus for drying a semiconductor substrate, said drying apparatus comprising:

evaporated organic solvent; and a nozzle through which said evaporated organic solvent is blown onto said semiconductor substrate at a rate of not less than 0.8 cc/second and not more than 1.5 cc/second.

7. The drying apparatus for drying a semiconductor substrate according to claim 6 wherein the amount of said organic solvent used for drying is not less than 70 cc/batch and not more than 200 cc/batch.

8. The drying apparatus for drying a semiconductor substrate according to claim 6 wherein said evaporated organic solvent is blown onto said semiconductor substrate by using a nozzle.

9. The drying apparatus for drying a semiconductor substrate according to claim 6 wherein an inactive gas is used as a carrier gas of said evaporated organic solvent.

10. The drying apparatus for drying a semiconductor substrate according to claim 6 wherein said organic solvent is isopropyl alcohol.

11. A drying apparatus for drying a semiconductor substrate, said drying apparatus comprising:

evaporated organic solvent; and a nozzle through which said evaporated organic solvent is blown onto said semiconductor substrate at a rate of not less than 70 cc/batch and not more than 200 cc/batch.

12. The drying apparatus for drying a semiconductor substrate according to claim 11 wherein said evaporated organic solvent is blown onto said semiconductor substrate by using a nozzle.

13. The drying apparatus for drying a semiconductor substrate according to claim 11 wherein an inactive gas is used as a carrier gas of said evaporated organic solvent.

14. The drying apparatus for drying a semiconductor substrate according to claim 11 wherein said organic solvent is isopropyl alcohol.

15. A drying apparatus for drying a semiconductor substrate, said drying apparatus comprising:

evaporated organic solvent; and a nozzle through which said evaporated organic solvent is blown onto said semiconductor substrate at a rate of not less than 0.6 cc/second and not more than 1.5 cc/second.

16. The drying apparatus for drying a semiconductor substrate according to claim 15 wherein the amount of said organic solvent used for drying is not less than 50 cc/batch and not more than 150 cc/batch.

17. A drying apparatus for drying a semiconductor substrate, said drying apparatus comprising:

evaporated organic solvent; and a nozzle through which said evaporated organic solvent is blown onto said semiconductor substrate at a rate of not less than 50 cc/batch and not more than 150 cc/batch.

18. A drying apparatus for drying a semiconductor substrate, said drying apparatus comprising:

evaporated organic solvent; and three or more nozzles through which said evaporated organic solvent is blown onto said semiconductor substrate.

19. The drying apparatus for drying a semiconductor substrate according to claim 18 wherein said semiconductor substrate is set to orient its surface substantially vertical to said nozzles, and at least one of said nozzles having a nozzle hole positioned at a height lower than the lower end of said semiconductor substrate during drying.

20. The drying apparatus for drying a semiconductor substrate according to claim 19 wherein said nozzle hole of said nozzle positioned at a height lower than said semiconductor substrate during drying is so positioned that a line connecting the center of a cross-sectional plane of said nozzle and the center of said nozzle hole lies between a horizontal direction and a line connecting said center of the cross-sectional plane of said nozzle and the lower end of said semiconductor substrate.

21. The drying apparatus for drying a semiconductor substrate according to claim 19 wherein said nozzle hole of said nozzle positioned at a height lower than said semiconductor substrate during drying is so positioned that a line connecting the center of a cross-sectional plane of said nozzle and the center of said nozzle hole lies within the range of angles from 0° to 45° from a horizontal direction toward said semiconductor substrate.

22. The drying apparatus for drying a semiconductor substrate according to claim 18 wherein four said nozzles are provided, and two of said four nozzles are located symmetrically with respect to said semiconductor substrate in a level higher than the center of said semiconductor substrate whereas the other two nozzles are located symmetrically with respect to said semiconductor substrate at a height lower than the lower end of said semiconductor substrate.

23. The drying apparatus for drying a semiconductor substrate according to claim 18 wherein an inactive gas is used as a carrier gas of said evaporated organic solvent.

24. The drying apparatus for drying a semiconductor substrate according to claim 18 wherein said organic solvent is isopropyl alcohol.

* * * * *